United States Patent
Ogawa et al.

(10) Patent No.: US 6,919,226 B2
(45) Date of Patent: Jul. 19, 2005

(54) METHOD FOR PRODUCING A MULTI-CHIP CIRCUIT MODULE INCLUDING A MULTI-LAYERED WIRING SECTION UTILIZING A VIA-ON-VIA STRUCTURE

(75) Inventors: Tsuyoshi Ogawa, Kanagawa (JP); Yuji Nishitani, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/466,748
(22) PCT Filed: Nov. 15, 2002
(86) PCT No.: PCT/JP02/11972

§ 371 (c)(1),
(2), (4) Date: Jul. 18, 2003

(87) PCT Pub. No.: WO03/044859

PCT Pub. Date: May 30, 2003

(65) Prior Publication Data

US 2004/0056344 A1 Mar. 25, 2004

(30) Foreign Application Priority Data

Nov. 22, 2001 (JP) ........................ 2001-358246

(51) Int. Cl.[7] .................. H01L 21/44; H01L 21/48; H01L 21/50
(52) U.S. Cl. .................. 438/108; 438/124; 438/622
(58) Field of Search ................ 438/108, 118, 438/622, 112, 124, 127, 107, 109–110, 618, 666–667, 672, 675; 257/778, 758, 787, 723, 686

(56) References Cited

U.S. PATENT DOCUMENTS

| | | | | |
|---|---|---|---|---|
| 3,862,017 A | * | 1/1975 | Tsunemitsu et al. | 205/124 |
| 5,151,388 A | * | 9/1992 | Bakhit et al. | 29/593 |
| 6,110,806 A | | 8/2000 | Pogge | |
| 6,184,143 B1 | * | 2/2001 | Ohashi et al. | 438/697 |
| 6,365,438 B1 | * | 4/2002 | Ishida et al. | 438/118 |

FOREIGN PATENT DOCUMENTS

| | | |
|---|---|---|
| JP | 2000-299428 A | 10/2000 |
| JP | 2001-168269 A | 6/2001 |
| JP | 2001-291819 A | 10/2001 |
| JP | 2002-170921 A | 6/2002 |

* cited by examiner

Primary Examiner—Hoai Pham
Assistant Examiner—Dilinh Nguyen
(74) Attorney, Agent, or Firm—Robert J. Depke; Trexler, Bushnell, Giangiorgi, Blackstone, & Marr

(57) ABSTRACT

A multi-chip circuit module on which semiconductor chips are loaded and which is provided with circuit patterns, input/output terminals or the like for interconnecting the semiconductor chips. A multi-layered wiring section (2) is formed by respective unit wiring layers (8) to (12) in such a manner that an upper unit wiring layer is layered on a surface-planarized subjacent unit wiring layer and connected to one another by inter-layer connection by a via-on-via structure. A semiconductor chip (6) mounted on this multi-layer wiring section (2) is polished along with the sealing resin layer (7) for reducing the thickness.

10 Claims, 30 Drawing Sheets

PRIOR ART

METHOD FOR PRODUCING A MULTI-CHIP CIRCUIT MODULE INCLUDING A MULTI-LAYERED WIRING SECTION UTILIZING A VIA-ON-VIA STRUCTURE

TECHNICAL FIELD

This invention relates to a multi-chip circuit module, having a plurality of semiconductor chips, such as ICs or LSIs, loaded thereon, and also having circuit patterns, interconnecting the semiconductor chips, and input/output terminals, formed thereon, and a manufacturing method for the multi-chip circuit module. This application claims priority of Japanese Patent Application No. 2001-358246, filed on Nov. 22, 2001, the entirety of which is incorporated by reference herein.

BACKGROUND ART

A multi-chip circuit module, having a plurality of semiconductor chips, such as ICs or LSIs, loaded thereon, is provided to electronic equipment adapted for handling digital signals, such as personal computers, portable telephone sets, video equipment or audio equipment. In this sort of the electronic equipment, attempts are made to reduce the size, weight and the thickness as well as to improve the performance and functions, diversify the functions and to expedite the processing, by reducing the size and improving the functions of the multi-chip circuit module by reducing the design rule of the circuit pattern and the size of the IC package, improving the degree of integration, increasing the number of package pins and by improving the mounting methods.

In certain types of the multi-chip circuit module, a so-called system LSI is formed by loading different functions, such as logic-memory functions or analog-digital functions. In certain types of the multi-chip circuit module, the functional blocks of the respective processes are manufactured by separate semiconductor chips which are then mounted on the same substrate to form a so-called multi-chip circuit module.

For further improving the performance in the multi-chip circuit module, the transmission speed and density of the signal lines across the microprocessor and memory chips prove a bottleneck, while the problem of delay caused in the signal lines needs to be tackled. In the multi-chip circuit module, even if the clock frequencies exceeding the GHz order is achieved within each device (chip), the clock frequencies need to be lowered by the order of magnitude of one digit because of such problems as signal delay or reflection. In the multi-chip circuit module, it is necessary to take measured against e.g., electromagnetic interference (EMI) or electromagnetic compatibility (EMC) by raising the transmission speed and density in the signal lines. Thus, in the multi-chip circuit module, it is necessary to improve the integration and performance not only as a chip technology but also as a system technology inclusive of the mounting technique of packages and boards. Among the conventional multi-chip circuit modules, there is such a one shown in FIG. 38. A multi-chip circuit module 100, shown in FIG. 38, is of the flip chip type in which plural semiconductor chips 102A, 102B are loaded on a major surface 101a of an interposer 101. In this multi-chip circuit module 100, suitable circuit patterns, lands or input/output terminals, not shown, are formed on front and back major surfaces 101a, 101b of the interposer 101. In the multi-chip circuit module 100, the semiconductor chips 102A, 102B are connected with a flip chip connection on predetermined lands 103 on the major surface 101a of the interposer 101, and the connection site is coated with an under-fill 104. In the multi-chip circuit module 100, solder balls 105 are loaded on the lands formed on the major surface 101b of the interposer 101. The multi-chip circuit module 100 may be mounted by reflow soldering to melt and solidiify the solder balls 105 by reflow soldering as the multi-chip circuit module 100 is set on for example a motherboard.

In the conventional multi-chip circuit module 100, the plural semiconductor chips 102A, 102B are mounted on the major surface 101a of the interposer 101 in the transversely arrayed state. In this case, the circuit pattern formed on the interposer 101 interferes with the wiring interconnecting the semiconductor chips 102A, 102B. In the multi-chip circuit module 100, an increasing number of semiconductor chips 102A, 102B are provided in keeping with the diversified functions and increasing speed of the device, so that an increasing number of the wirings are needed. In the multi-chip circuit module 100, the pitch of the wiring path formed in the interposer 101 manufactured by the routine substrate manufacturing technique is large and is of the order of approximately 100 µm in the least, due to e.g., constraints imposed by manufacturing conditions, such that the interposer 101 needs to be of a large area or of multiple layers in case of providing many interconnections across plural semiconductor chips 102A, 102B.

If, in the multi-chip circuit module 100, the multi-layered interposer 101 is used, inter-layer connections or connections across the semiconductor chips 102A, 102B are made through vias. From the working conditions, the via diameter is approximately 50 µm in the least, while the land diameter is approximately 50 µm in the least, so that the interposer 101 needs to be of a large size. In the multi-chip circuit module 100, the wiring path on the interposer 101 interconnecting the semiconductor chips 102A, 102B is elongated, such that L-C-R components are increased.

In the multi-chip circuit module 100, plural semiconductor chips 102A, 102B are mounted on one major surface of the interposer 101, while the other major surface thereof are provided with numerous connection bumps so as to be used as a mounting surface for mounting on a motherboard. Thus, the multi-chip circuit module 100 is implemented as a single surface mounting type module not provided on its mounting surface with the semiconductor chips 102A, 102B or other electronic components to render it difficult to take in the peripheral circuit of the semiconductor chips 102A, 102B or to achieve a high density mounting.

DISCLOSURE OF THE INVENTION

It is therefore an object of the present invention to provide a multi-chip circuit module, whereby the problems inherent in the conventional multi-chip circuit module may be overcome, and a manufacturing method therefor.

It is another object of the present invention to provide a a multi-chip circuit module in which a fine circuit pattern is formed to high density in a multi-layered wiring section, the thickness of the module is diminished and the wiring length of the semiconductor chip is reduced to improve the processing speed and operational reliability.

For accomplishing the above objects, the present invention provides a multi-chip circuit module including a multi-layered wiring section in which a plurality of unit wiring layers having a preset circuit pattern formed in an insulating layer and having planarized surfaces are connected layer-to-layer to provide a multi-layered structure, and in which a connection terminal is provided to the unit wiring layer forming an outermost layer, a semiconductor chip mounted on the major surface of at least one outermost unit wiring layer of the multi-layered wiring section, and a sealing resin layer provided on the major surface of the outermost unit wiring layer for sealing the semiconductor chip and the connection terminal. In the multi-chip circuit module, the sealing resin layer is polished to polish the semiconductor chip as well as to expose the connection terminal to outside.

In the multi-chip circuit module of the present invention, the respective unit wiring layers are layered together by inter-layer connection by a so-called via-on-via structure in which respective upper unit wiring layers are layered on planarized subjacent unit wiring layers so that a fine circuit pattern in meeting with the large capacity high speed high density buses interconnecting the respective semiconductor chips may be formed to high accuracy within the multi-layered wiring section. With this multi-chip circuit module, the semiconductor chips are directly loaded on the multi-layered wiring sections forming a fine circuit pattern of high density and are interconnected thereby reducing the wiring length to lower the attenuation of transmitted signals as well as to minimize the signal delay. Moreover, the multi-chip circuit module according to the present invention may be further reduced in thickness by mounting the semiconductor chip on the multi-layered wiring sections reduced in thickness and by polishing the sealing resin layers sealing the semiconductor chips by way of polishing from one semiconductor chip to another.

For accomplishing the above objects, the present invention also provides a method for producing a multi-chip circuit module including a release layer forming step of forming a release layer of a uniform thickness on the major surface of a planarized base substrate, a first-layer unit wiring layer forming step of forming a first-layer unit wiring layer, obtained on forming an insulating layer on the release layer of the base substrate and on forming a predetermined circuit pattern in the insulating layer, a planarizing step of planarizing the surface of the first-layer unit wiring layer, a unit wiring layer forming step of forming an insulating layer on a planarized first-layer unit wiring layer, forming a preset circuit pattern in the insulating layer, planarizing the resulting first-layer unit wiring layer, sequentially layering a second-layer unit wiring layer and so forth, interconnecting the layered unit wiring layers by inter-layer connection to form a multi-layer structure and a mounting step of mounting at least one or more semiconductor chips on the major surface of the uppermost unit wiring layer of the multi-layer wiring section, a sealing resin layer forming step of forming a sealing resin layer for sealing the semiconductor chip on the major surface of the uppermost unit wiring layer, a polishing step of performing polishing processing on the sealing resin layer for polishing up to the semiconductor chip and a peel-off step of peeling the multi-layer wiring section from the base substrate via the release layer.

The present invention also provides a provides a method for producing a multi-chip circuit module in which the unit wiring layer forming step includes a first connection terminal forming step of forming a first connection terminal on the major surface of the uppermost unit wiring layer, and in which the first polishing step is a step of polishing the first sealing resin layer along with the first semiconductor chip to expose the first connection terminal. The method includes, as post-stage steps to the first polishing step, a second base substrate bonding step of bonding a second base substrate, having a release layer formed on a planar major surface thereof, to the major surface of the uppermost unit wiring layer, a first base plate releasing step of peeling off the first base plate via the release layer from the first-layer unit wiring layer, a second connection terminal forming step of forming a second connection terminal on the major surface of the first-layer unit wiring layer, a second semiconductor chip mounting step of mounting at least one second semiconductor chip, a second sealing resin forming step of forming a second sealing resin layer, sealing the second connection terminal and the second semiconductor chip, on the major surface of the first-layer unit wiring layer, and a second polishing step of polishing the second sealing resin layer along with the second semiconductor chip to expose the second connection terminal.

With the method for producing a multi-chip circuit module, including the above-described steps, the respective unit wiring layers are planarized and are on the subjacent unit wiring sections to form a multi-layer wiring section, so that a multi-chip circuit module is produced which has a high accuracy multi-layer wiring section forming a high density fine circuit pattern in meeting with the large capacity high speed high density bus between the semiconductor chips to reduce the wiring length between the respective semiconductor chips. With the manufacturing method for the multi-chip circuit module, a multi-chip circuit module is produced which is significantly reduced in thickness by peeling off the base substrate of a certain thickness from the multi-layer wiring section by a peel-off process and by polishing the sealing resin layer and the semiconductor chip. With the present manufacturing method for the multi-chip circuit module, a multi-chip circuit module of a reduced thickness may be produced in which, although there is no base substrate, forming a rigid section, the sealing resin layer formed on the multi-layer wiring section and the polished semiconductor chip form a rigid section so that the circuit module may be mounted on e.g., a motherboard in substantially the same way as in the conventional system.

With the manufacturing method for the multi-chip circuit module, a multi-chip circuit module is produced in which a semiconductor chip reduced in thickness by polishing the second major surface of the multi-layer wiring section is loaded on the major surface of the multi-layer wiring section from which the first base substrate has been peeled off, whereby a high accuracy multi-function multi-chip circuit module of a reduced thickness and size mounting a large number of semiconductor chips is produced. With the manufacturing method for the multi-chip circuit module, the semiconductor chips, mounted on both sides with the multi-layer wiring section inbetween, are interconnected by a wiring of the shortest length via a fine high density circuit pattern formed in the multi-layer wiring section, so that a multi-chip circuit module is produced in which attenuation of transmitted signals may be diminished and signal delay may be minimized.

Other objects, features and advantages of the present invention will become more apparent from reading the embodiments of the present invention as shown in the drawings.

BRIEF DESCRIPTION OF THE DRAWINGS

FIG. 11 illustrates a process for forming a pattern of a capacitor device and a resistor device on the TaN layer.

FIG. 12 illustrates a process for forming an upper electrode of the capacitor device.

FIG. 13 illustrates another device forming method and specifically a process for forming a TaO film.

FIG. 14 illustrates a process for forming a capacitance device and a resistance device.

BEST MODE FOR CARRYING OUT THE INVENTION

Figure 1:
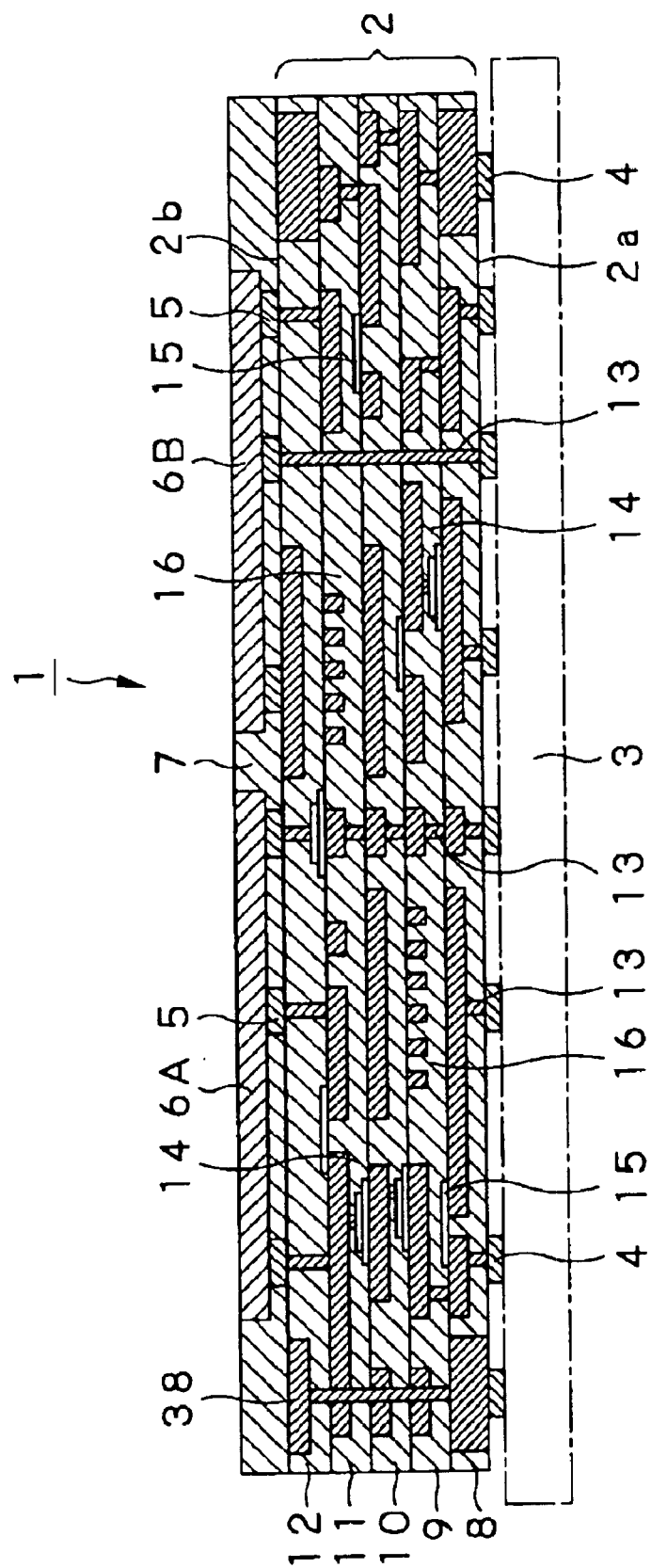
FIG. 1 is a longitudinal cross-sectional view showing a multi-chip circuit module according to the present invention.

Referring to the drawings, certain preferred embodiments of the present invention are explained in detail.

A multi-chip circuit module 1, referred to below simply as a circuit module 1, embodying the present invention, has e.g., an information communication function or a storage function, and forms a high frequency circuit of an ultra-small-sized communication functional module unit, which is loaded on a variety of electronic equipment, such as a portable telephone set or an audio equipment, or which is inserted or unloaded as an optional device. Although not shown in detail, the circuit module 1 includes a high frequency transmitting/receiving circuit section by a super-heterodyne system of converting the transmitted/received signal to an intermediate frequency or a high frequency transmitting/receiving circuit section by a direct conversion system of transmitting/receiving information signals without conversion to an intermediate frequency.

Referring to FIG. 1, the circuit module 1 according to the present invention includes a multi-layer wiring section 2, on a first major surface 2a of which a large number of mounting bumps 4 for mounting on an interposer 3 are formed, and on a second major surface 2b of which a plurality of, herein two, semiconductor chips (LSIs) 6A, 6B are loaded via a large number of semiconductor mounting bumps 5, formed on the second major surface, and a sealing resin layer 7 for sealing the semiconductor chips 6A, 6B. The multi-layer wiring section 2 of the circuit module 1 is formed to for example a five-layer structure by layering a second-layer unit wiring layer 9 on the major surface of a first-layer unit wiring layer 8, layering a third-layer unit wiring layer 10 on the major surface of a second-layer unit wiring layer 9 and so on up to a fifth-layer unit wiring layer 12, by a process which will be explained in detail subsequently.

For the multi-layer wiring section 2 of the circuit module 1, preset inter-layer interconnection is made by suitable vias 13 traversing the entire layers, upper and lower layers or plural layers of the first-layer unit wiring layer 8 to the fifth-layer unit wiring layer 12. The respective unit wiring layers of the multi-layer wiring section 2 of the circuit module 1 are of the so-called via-on-via structure in which a via of a unit wiring layer is directly formed on a subjacent unit wiring layer. The circuit module 1 is mounted on the interposer 3 whereby predetermined signals or the power are supplied from a circuit section of the interposer 3 to the multi-layer wiring section 2.

Thus, the wiring length of the circuit module 1 is shortened by the interposer 3 and the respective semiconductor chips 6A, 6B mounted on the second major surface 2b of the multi-layer wiring section 2 through the vias 13. On the circuit module 1, interconnections are made such as to diminish the attenuation of transmission signals between the interposer 3 and the respective semiconductor chips 6A, 6B and to reduce the signal delay to a minimum.

The circuit module 1 is reduced in thickness in its entirety by polishing the semiconductor chips 6A and 6B and the sealing resin layer 7, as will be explained in detail subsequently. In the circuit module 1, the multi-layer wiring section 2 is formed by layering the first-layer unit wiring layer 8 to the fifth-layer unit wiring layer 12 on a first base substrate 20 provided with a release layer 21 having a planar major surface, as later explained in detail. The multi-layer wiring section 2 is peeled from the first base substrate 20 via release layer 21 by a predetermined process. The first base substrate 20 may be re-used as necessary.

The multi-layer wiring section 2 of the circuit module 1 is formed by planarizing the major surfaces of the first-layer unit wiring layer 8 to the fifth-layer unit wiring layer 12 and by layering respective unit wiring layers on the subjacent unit wiring layers. Thus, the circuit patterns of the respective unit wiring layers of the circuit module 1 are formed to high precision and to high density, while the circuit module 1 is reduced in thickness. Since the multi-layer wiring section 2 of the circuit module 1 is reduced in thickness, the wiring length of the respective semiconductor chips 6A, 6B is reduced further.

Within the multi-layer wiring section 2 of the circuit module 1, a capacitance device 14, a resistance device 15 or an inductance device 16 are formed by a thin film technique or by a thick film technique. The capacitance device 14 may, for example, be a decoupling capacitor or a capacitor for DC cutting, and is formed by a tantalum oxide (TaO) film. The capacitance device 14 may, for example, be a tantalum nitride (TaN) film. The resistance device 15 is e.g., a resistor for terminal resistance, and is formed by a tantalum nitride film. Since the first-layer unit wiring layer 8 to the fifth-layer unit wiring layer 12 of the circuit module 1 are formed on the respective planarized subjacent unit wiring layers, the capacitance device 14, resistance device 15 and the inductance device 16 may be formed to a high precision. Since the capacitor or the resistor, hitherto formed as chip components, are now formed as thin films in the multi-layer wiring section 2, it becomes possible to mount passive devices of an extremely small size and a high performance.

The respective unit wiring layers of the circuit module 1 are formed by respective insulating layers and circuit patterns containing the above devices and which are formed on the insulating layers. The circuit pattern of the circuit module 1 is formed by plating highly electrically conductive Cu on the insulating layer. In forming the respective unit wiring layers of the circuit module 1, the circuit pattern sites are formed by fine grooves, and the entire upper surface is plated with Cu. The resulting plating layer and the insulating layer are polished to planarize the major surface. In the respective unit wiring layers, via-holes are pre-formed at preset positions of the insulating layer, so that, on Cu plating, a Cu plating layer is formed in the via-hole as well to form a via for interlayer connection 13.

The above-described circuit module 1 is formed by a multi-layer wiring section forming step of layering the first-layer unit wiring layer 8 to the fifth-layer unit wiring layer 12 on the first base substrate 20 to form the above-mentioned multi-layer wiring section 2, a semiconductor chip mounting step of mounting the semiconductor chips 6A and 6B on the multi-layer wiring section 2, and a sealing resin layer forming step of sealing the semiconductor chips 6A and 6B with the sealing resin layer 7. The circuit module 1 is completed by a polishing step of simultaneously polishing the semiconductor chips 6A and 6B and the sealing resin layer 7 and by a peel-off step of peeling the multi-layer wiring section 2 from the first base substrate 20.

In producing the circuit module 1, a second base substrate 40 is bonded to the surface-polished sealing resin layer 7, as a preliminary step of the peel-off step of the first base substrate 20, and a post-processing step is then carried out, with this second base substrate 40 as a supporting substrate. The circuit module 1 is manufactured by respective steps, which will be explained in detail subsequently, whereby the surface area may be reduced to approximately one-tenth of that produced by the printing method or the wet etching method used in the conventional manufacturing process for the conventional wiring substrate, while the high frequency circuit may be produced in which the use limit frequency range is increased to 200 GHz.

With the circuit module 1, the first-layer unit wiring layer 8 to the fifth-layer unit wiring layer 12 of the multi-layer wiring section 2 may each be formed to a thickness on the order of, for example, 5 μm, so that the entire thickness of the multi-layer wiring section 2 may be kept to the order of tens of μm. The circuit module 1 may be reduced in thickness because the semiconductor chips 6A and 6B may be polished to the maximum extent possible to a thickness on the order of 100 μm. The circuit module 1 may be formed to a fine and accurate finish with the via diameter on the order of a few μm, while the circuit pattern may be formed to the level of a few μm. Since the circuit module 1 is provided with the first-layer unit wiring layer 8 to the fifth-layer unit wiring layer 12 of a planarized multi-layered structure, it is possible to form an impedance-controlled circuit pattern such as a micro-strip line comprised of a ground connection sandwiched between upper and lower layers.

Figure 2:
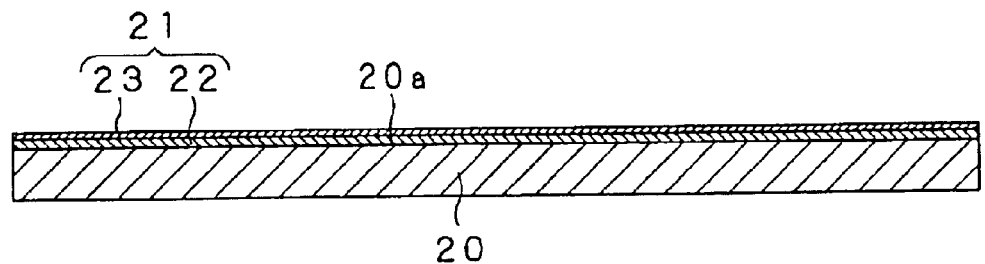
FIG. 2 is a longitudinal cross-sectional view of a base substrate used for a manufacturing process of the multi-chip circuit module.

In the manufacturing process for the circuit module 1, the first base substrate 20 is provided, as shown in FIG. 2. The first base substrate 20 is formed of a substrate material, such as Si, glass or quartz, which is resistant to heat and to chemicals, enables the formation of a planar surface to a precise finish and which exhibits mechanical toughness. With the first base substrate 20 being formed of this substrate material, thermal changes may be suppressed against rise in the surface temperature, at the time of sputtering, as later explained, to enable the circuit module 1 to be produced to high accuracy, as depth of focus at the time of lithographic processing is maintained and masking contact alignment characteristics are improved. Meanwhile, not only the above-mentioned substrate material but also other suitable planarized substrate materials may also be used.

The first base substrate 20 is polished so that its major surface 20a is planarized to high precision. The release layer 21 is made up by a thin metal film layer 22 of e.g., copper or aluminum, formed to an entire surface on the major surface 20a of the first base substrate 20, to a uniform thickness of the order of 1000 Å, by e.g., a sputtering method or by a chemical vapor deposition method, and by a thin resin film layer 23 of e.g., polyimide resin, formed to an entire surface on the thin metal film layer 22 to a thickness on the order of 1 to 2 μm by for example, a spin coating method. With the release layer 21, the multi-layer wiring section 2 is peeled from the first base substrate 20, in the peel-off step, as later explained, with the first-layer unit wiring layer 8 as the release surface.

In the manufacturing process of the first-layer unit wiring layer 8, the step of forming a first insulating layer 24 on the release layer 21 of the first base substrate 20 is the first step. The first insulating layer 24 is formed of an insulating dielectric material, having a low dielectric constant and a low Tanδ, that is, superior in high frequency characteristics, resistance against heat and resistance against chemicals, such as polyimide, benzocyclobutene (BCB), liquid crystal polymer (LCP), polynorbornene (PNB), bismaleidotriazine (BT-resin), polyphenylethylene (PPE), an epoxy resin or an acrylic resin. The first insulating layer 24 is formed by a suitable insulating material having the above characteristics.

Figure 3:
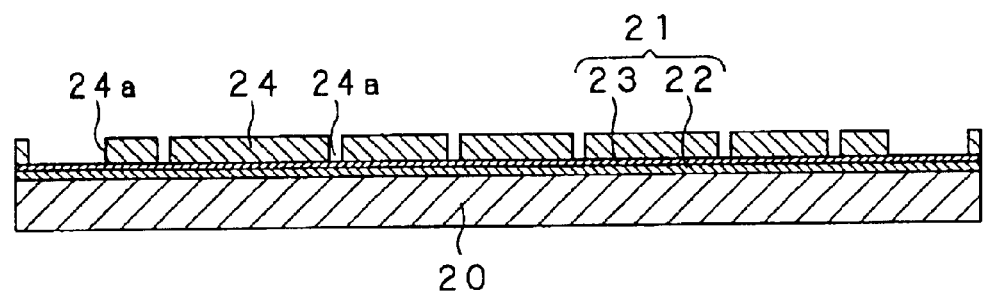
FIG. 3 illustrates the process of forming an insulating layer of a first-layer unit wiring section formed on a base substrate.

The first insulating layer 24 is formed to a uniform thickness, using the above-mentioned liquid insulating material, on the release layer 21, except the portions thereof which later become the vias, as openings 24a, as shown in FIG. 3. Specifically, the first insulating layer 24 is formed on coating a liquid insulating material on the release layer 21 by for example a spin coating method, a curtain coating method, a roll coating method or a dip coating method, guaranteeing coating evenness and thickness controllability, to form an entire insulating layer of an even thickness, and on subsequent patterning. If a photosensitive insulating material is used, the first insulating layer 24 is formed by patterning the insulating layer by for example a photolithographic technique. If the non-photosensitive insulating material is used, the first insulating layer 24 is formed by patterning the entire insulating layer using e.g., a photolithographic technique, dry etching processing or patterning with the use of laser machining.

Figure 4:
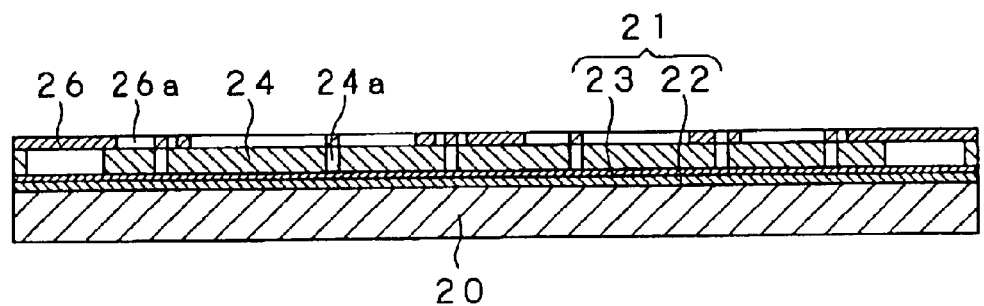
FIG. 4 illustrates a mounting process for an etching mask for forming a circuit pattern on an insulating layer of the first-layer unit wiring section.
Figure 5:
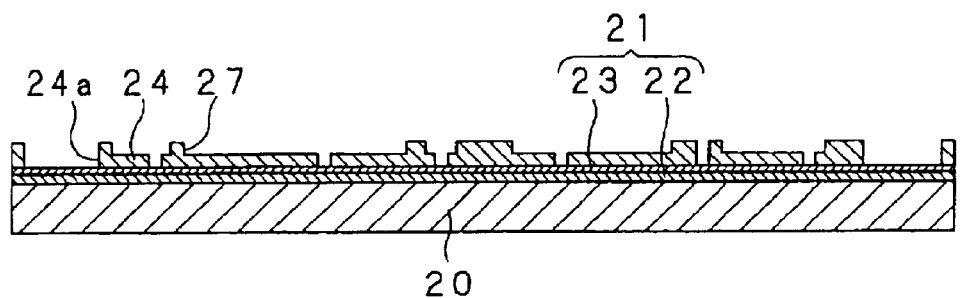
FIG. 5 illustrates a process for forming a circuit pattern groove on an insulating layer of the first-layer unit wiring section.

In the manufacturing process for the first-layer unit wiring layer 8, the process of etching the first insulating layer 24 for forming a first circuit pattern 25 is the second step. An etching mask 26, in which a preset opening 26a has been formed in association with the first circuit pattern 25, is bonded in position to the first insulating layer 24, as shown in FIG. 4. As for the etching processing, dry etching, exemplified by reactive ion etching (RIE) by oxygen plasma, is applied to form wiring grooves 27 in the first insulating layer 24 in association with the first circuit pattern 25, as shown in FIG. 5. The respective wiring grooves 27 are formed to such a depth in which the first insulating layer 24 is partially left in the release layer 21.

Figure 6:
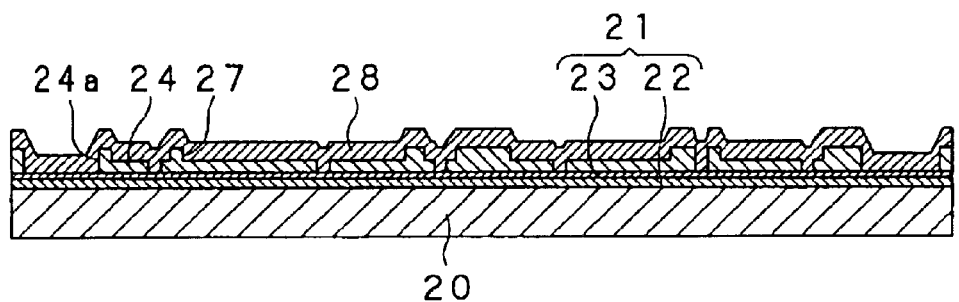
FIG. 6 illustrates a process for applying metal plating to the insulating layer of the first-layer unit wiring section.

In the manufacturing process of the first-layer unit wiring layer 8, a step of applying metal plating on the first insulating layer 24, in which the wiring grooves 27 have been formed by the above step, is the third step. If, in the circuit module 1, the grounding or the power supply unit is to be formed, the first circuit pattern 25 is preferably of a certain thickness, and may be formed to a thick film by metal plating processing. The metal plating processing may be by electrolytic plating or electroless plating. A metal plating layer 28 having a preset thickness is formed on the entire area from the entire surface of the first insulating layer 24 including the wiring grooves 27 to the surface of the release layer 21 exposed via the openings 24a formed in the first insulating layer, as shown in FIG. 6. If the metal plating layer 28 is formed by the electrolytic plating, in the metal plating processing, the release layer 21 operates as the voltage applying electrode. The metal plating processing is by copper plating of forming a copper plating layer 28 excellent in electrical conductivity.

Figure 7:
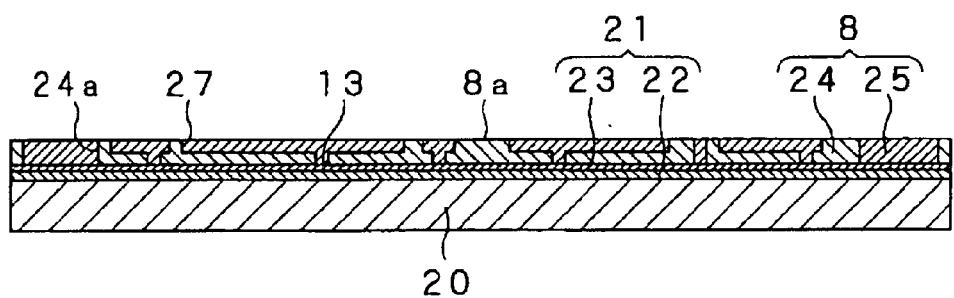
FIG. 7 illustrates a process for applying planarizing processing to the insulating layer of the first-layer unit wiring section.

In the manufacturing process of the first-layer unit wiring layer 8, the step of polishing the copper plating layer 28 to planarize its major surface is the fourth step. In the planarizing processing, the surface 8a of the first-layer unit wiring layer 8 is formed to a planar surface of high accuracy, as shown in FIG. 7. Since the first insulating layer 24 and the copper plating layer 28 of respective different materials are polished simultaneously, the chemical-mechanical polishing (CMP), for example, is used for the polishing step. The CMP has selectivity for the high degree of polishing, that is selectivity for increasing the polishing rate for the copper plating layer 28, and forms a polished surface exhibiting high degree of planarity.

In the first-layer unit wiring layer 8, the wiring grooves 27 are formed in the first insulating layer 24, as described above, and the copper plating layer 28, formed to an entire surface, is processed with CMP until the first insulating layer 24 is exposed to form the planarized first circuit pattern 25. In the first-layer unit wiring layer 8, the copper plating is applied to the openings 24a corresponding to the vias, as shown in FIG. 7, so that an interlayer connecting via 13 is formed simultaneously. In the first-layer unit wiring layer 8, the surface of the interlayer connecting via 13 is also planarized to high precision, so that it becomes possible to directly form an interlayer connection via from the upper second-layer unit wiring layer 9 to the fifth-layer unit wiring layer 12 through the unit wiring layer manufacturing process, as later explained, thereby forming a via-on-via structure as described above. The via-on-via provides for the shortest wiring length between the multi-layer wiring section 2 and the interposer 3 by interconnecting the first-layer unit wiring layer 8 to the fifth-layer unit wiring layer 12 with the shortest wiring length.

Figure 8:
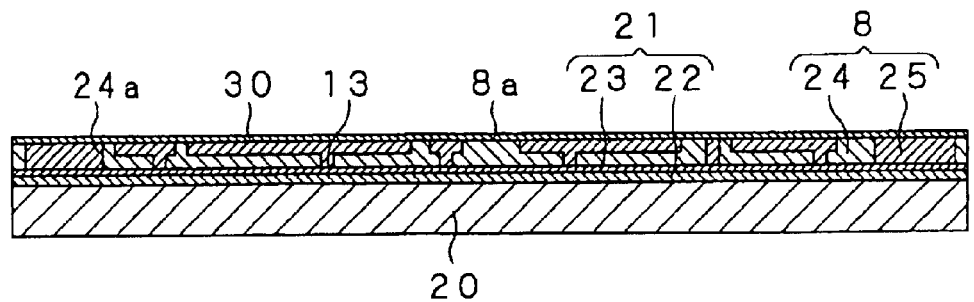
FIG. 8 illustrates a process for forming a TaN layer on the insulating layer of the first-layer unit wiring section.

A device forming step is applied to the first-layer unit wiring layer 8 to form the capacitance device 14 and the resistance device 15 on its surface 8a. In the device forming step, an inductance device may also be formed as necessary. In the device forming step, an anodically oxidized TaO capacitance device 14 and a TaN resistance device 15, for example, are formed by film forming. In the device forming step, the step of forming a tantalum nitride (TaN) layer 30 on the entire surface 8a of the first-layer unit wiring layer 8 by for example a sputtering method or by a CVD method, as shown in FIG. 8, is the first step.

Figure 9:
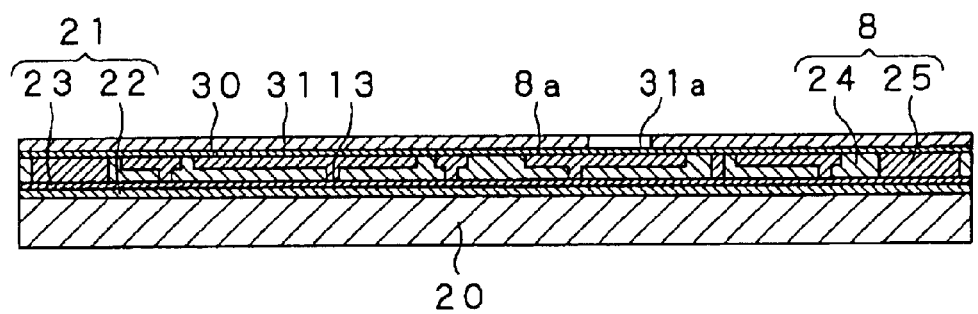
FIG. 9 illustrates a process for bonding a device forming mask to the TaN layer.
Figure 10:
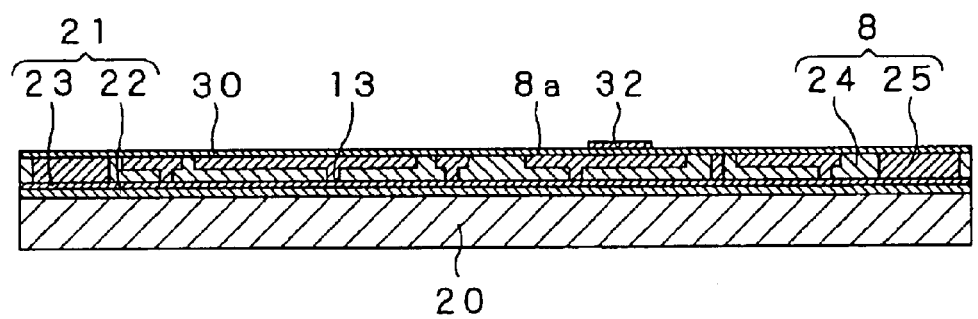
FIG. 10 illustrates a process for forming a TaO film, which is to become a lower electrode film of a capacitor device, on the TaN layer.
Figure 1:
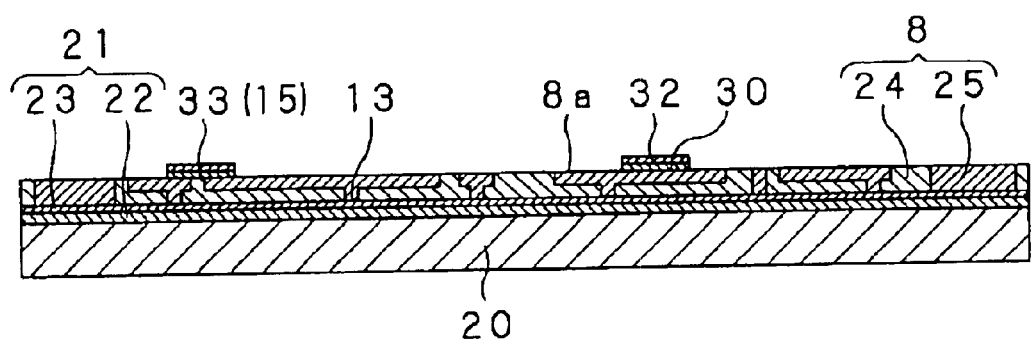
Figure 1:
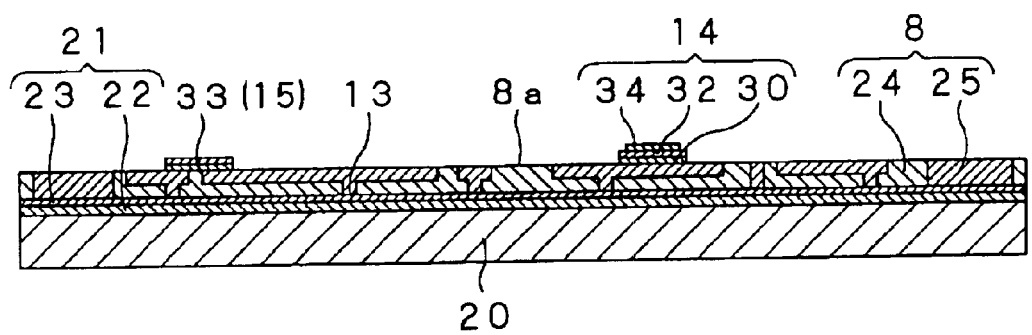
Figure 1:
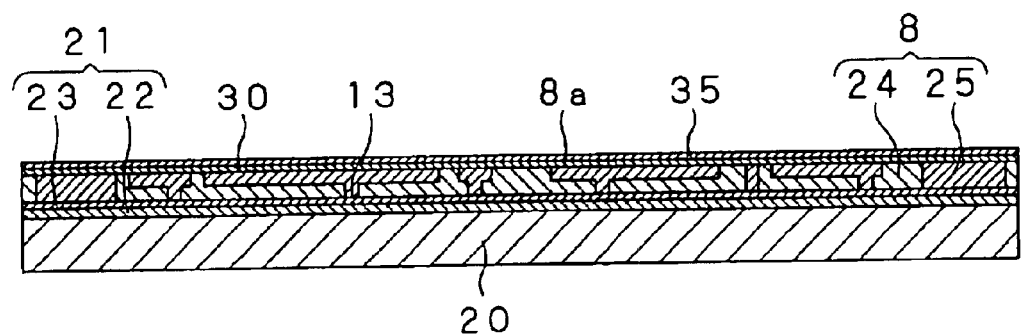
Figure 1:
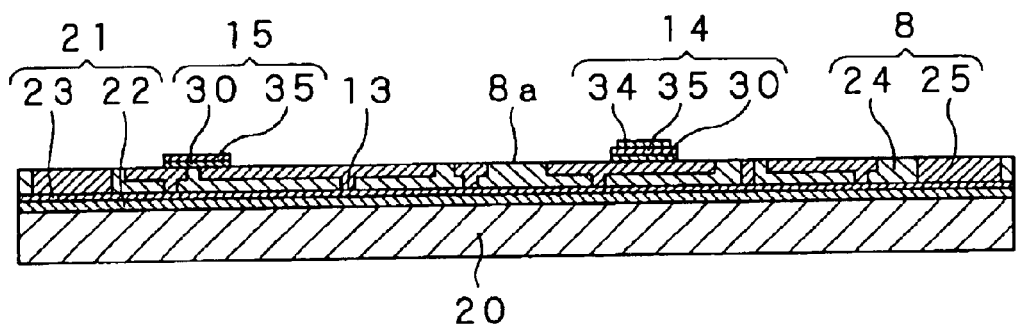

In the device forming step, the step of forming a device forming mask 31, in which there is formed an opening 31a in register with the forming area for the capacitance device 14 on the TaN layer 30, as shown in FIG. 9, is a second step. The device forming mask 31 is formed by coating a routine photoresist material on the TaN layer 30 to a larger thickness of not less than approximately 10 μm. In the device forming step, the step of applying the anodic oxidation to the TaN layer 30 to form a TaO layer 32 on a lower electrode of the capacitance device 14 formed in a portion of the first circuit pattern 25 as shown in FIG. 10 is a third step. In the anodic oxidation processing, a voltage on the order of 50V to 200V in for example an ammonium borate solution using the TaN layer 30 as a seed metal material to form the TaO layer 32 in register with the opening 31a of the device forming mask 31. The TaO layer 32 forms a dielectric film of the capacitance device 14.

In the device forming step, the step of patterning the TaN layer 30 in a predetermined manner to form the capacitance device 14 and the resistance device 15 by patterning is a fourth step. In the patterning processing, the TaN layer 30 is masked in keeping with the required pattern and subjected to a photolithographic processing to remove unneeded portions of the TaN layer 30. On the surface 8a of the first-layer unit wiring layer 8, the TaO layer 32 is formed in register with the forming region for the capacitance device 14, while a resistance device pattern 33 is formed thereon such as to leave a portion of the TaN layer 30 in register with a forming region for the resistance device 15, as shown in FIG. 11.

In the device forming step, the step of forming an upper electrode 34 on a site in register with the forming region for the capacitance device 14 as shown in FIG. 12 is a fifth step. In the upper electrode forming step, the upper electrode 34 composed of a copper layer and a nickel layer is formed by a lift-off method as a mask having an opening in register with the forming region for the capacitance device 14 is applied. In the upper electrode forming step, the upper electrode 34 may be formed by for example a wet etching method. In the device forming step, the capacitance device 14 and the resistance device 15 are formed as films simultaneously on the surface 8a of the first-layer unit wiring layer 8, as described above.

In the manufacturing process for the circuit module 1, the first-layer unit wiring layer 8 is formed on the first base substrate 20, exhibiting thermal resistance and resistance against heat, and which has been formed to a high degree of planarity. This first-layer unit wiring layer 8 is then planarized. Thus, in the device forming step, the capacitance device 14 and the resistance device 15 are formed as films simultaneously to high accuracy on the first-layer unit wiring layer 8, without being affected by sputtering heat or chemicals used for etching, as the depth of focus at the time of photolithographic processing and contact alignment at the time of masking are maintained.

The device forming step is not limited to the aforementioned first to fifth steps. For example, the capacitance device 14 and the resistance device 15 may be formed as films simultaneously after forming the TaN layer 30 as a film, without employing the device forming mask 31. In the device forming step, a TaO layer 35 of a predetermined thickness is formed on the entire surface of the TaN layer 30, by processing the first-layer unit wiring layer 8, carrying the TaN layer 30, with anodic oxidation, as shown in FIG. 13. In the device forming step, the capacitance device 14 and the resistance device 15 are formed simultaneously as films by forming the upper electrode 34 of the capacitance device 14, as shown in FIG. 14, by patterning the TaN layer 30 and the TaO layer 35 in a predetermined manner. The resistance device 15 is formed by the TaN layer 30 provided with the TaO layer 35.

In the device forming step, the capacitance device 14 and the resistance device 15 are formed by respective independent steps in case these devices are not provided in the respective unit wiring layers as later explained. The capacitance device 14 may directly be formed as a thin film of a dielectric layer on a circuit pattern by for example the sputtering method or by the CVD method. The resistance device 15 is also formed by a step different from the step for the capacitance device 14 in for example a circuit pattern forming site by forming a film of a resistance device forming material, such as TaN, Ta, Ni—Cr or RuO2, by a photolithographic technique, a sputtering method or by a CVD method.

In the manufacturing process for the circuit module 1, the second-layer unit wiring layer 9 is deposited through the second insulating layer forming step, an etching step, a wiring groove forming step, a plating step and a planarizing step, as in the manufacturing process for the first-layer unit wiring layer 8 described above. The capacitance device 14 and the resistance device 15 are coated by a second insulating layer 36 forming the second-layer unit wiring layer 9. The second insulating layer 36, provided with the wiring grooves and processed with CMP by the planarizing step, is formed to a thickness such that the capacitance device 14 and the resistance device 15 are maintained in the coated state without being exposed to the wiring grooves or to the surface. The second-layer unit wiring layer 9, in a portion of the second circuit pattern of which a capacitance device 14B and a resistance device 15B are formed as films, is also provided with an inductance device 16B formed by plating a recessed spirally extending pattern.

Figure 15:
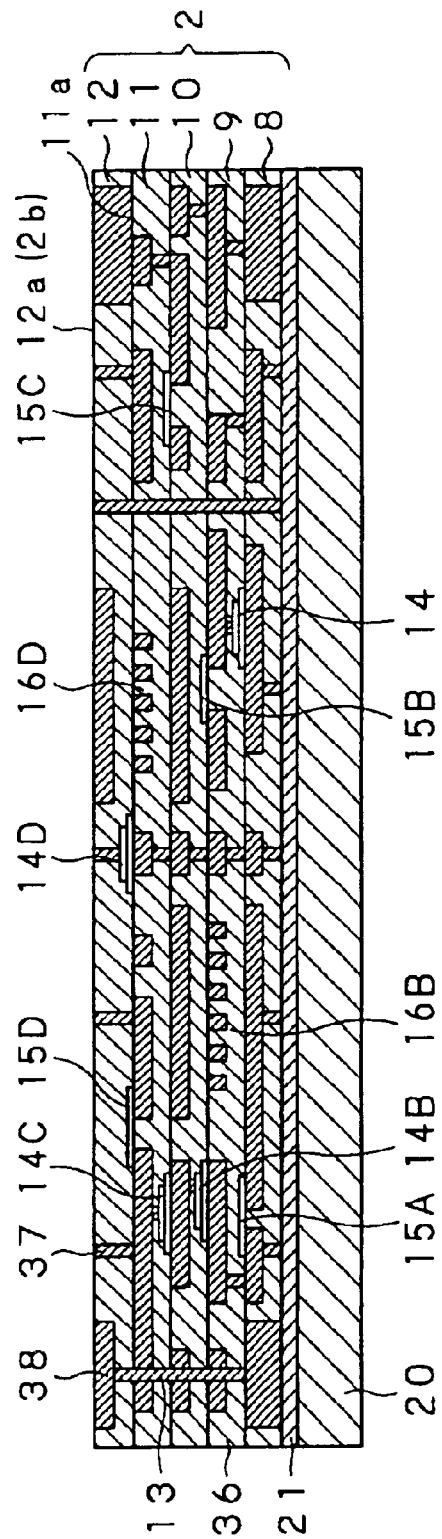
FIG. 15 illustrates a state in which a multi-layer wiring section is formed on a first base substrate.

In the manufacturing process for the multi-layer wiring section 2, the third unit wiring layer 10 is deposited by the above-described process steps on the planarized surface of the second-layer unit wiring layer 9, a fourth-layer unit wiring layer 11 is deposited on the third-layer unit wiring layer 10 and a fifth-layer unit wiring layer 12 is deposited on the fourth-layer unit wiring layer 11, whereby the multi-layer wiring section 2 composed of five unit wiring layers is formed on the first base substrate 20, as shown in FIG. 15.

In the multi-layer wiring section 2, a capacitance device 14C and a resistance device 15C are deposited as films in the third circuit pattern of the third-layer unit wiring layer 10. An inductance device 16D is formed in the fourth circuit pattern of the fourth-layer unit wiring layer 11, while a capacitance device 14D and a resistance device 15D are formed as films. The surface 12a of the fifth-layer unit wiring layer 12 forms the second major surface 2b of the multi-layer wiring section 2, with the fifth circuit pattern being flush with the insulating layer. In a fifth circuit pattern of the fifth-layer unit wiring layer 12 of the multi-layer wiring section 2, there are formed, by the mounting process, as later explained, a large number of electrode pads 37 for mounting the semiconductor chips 6A, 6B, and a connection terminal section 38 for interconnection to other electronic parts or modules.

In the manufacturing process of the multi-layer wiring section 2, in which respective unit wiring layers are deposited on the planarized subjacent unit wiring layers, the fifth-layer unit wiring layer 12 free of warping, inundations or micro-irregularities may be formed without the thicknesses of the respective subjacent circuit patterns being accumulated to affect the unit wiring layers of the respective upper layers. Thus, in the manufacturing process for the multi-layer wiring section 2, in which the fifth-layer unit wiring layer 12 is formed on the planarized surface 11a of the fourth-layer unit wiring layer 11, the electrode pads 37 with a narrow pitch can be formed to high accuracy. Meanwhile, in the manufacturing process for the multi-layer wiring section 2, electroless nickel/copper plating, for example, is applied to the electrode pads 37 and to the connection terminal section 38 to form the terminals.

Figure 16:
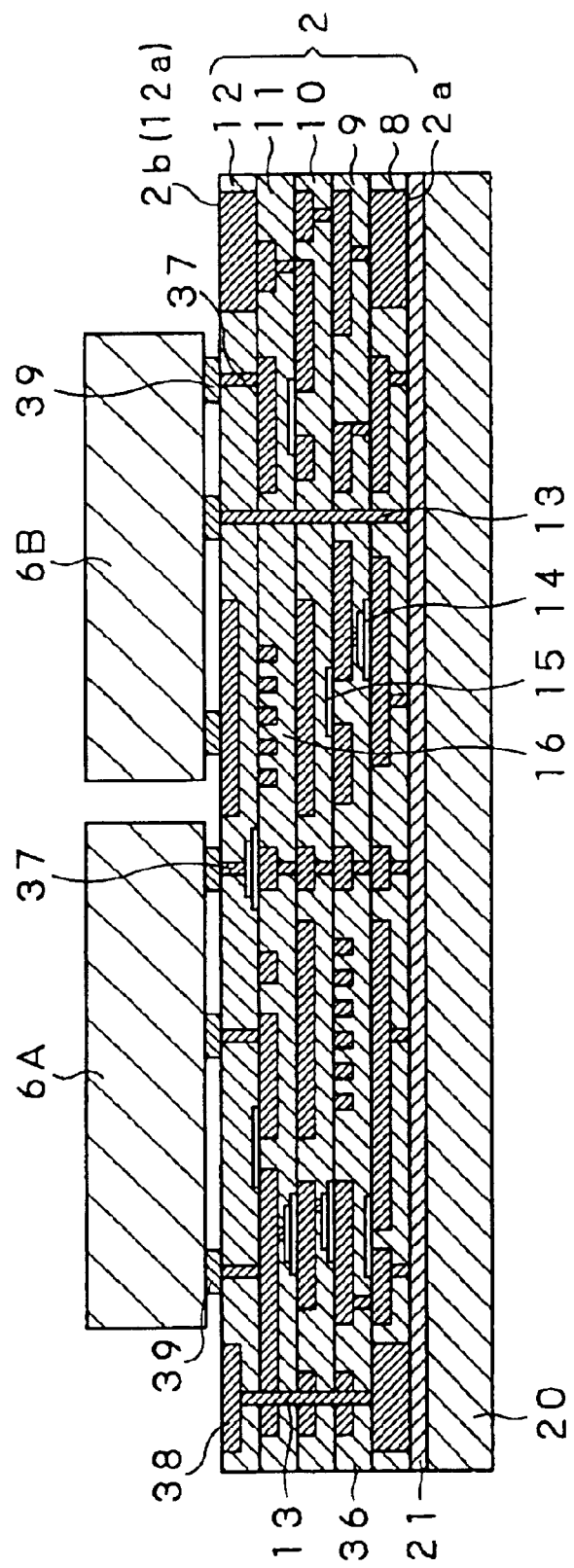
FIG. 16 illustrates a process for mounting semiconductor chips on a multi-layered wiring section.

The multi-layer wiring section 2, prepared by the above-described steps, the semiconductor chip mounting process of mounting the semiconductor chips 6A and 6B on the surface 12a of the second major surface 2b, that is the surface 12a of the fifth-layer unit wiring layer 12, is carried out. The semiconductor chip mounting process is comprised of a step of mounting semiconductor bumps 39 on the respective electrode pads 37 formed on the fifth-layer unit wiring layer 12 and a step of applying soldering after positioning and setting the semiconductor chips 6A, 6B. In the semiconductor chip mounting process, the semiconductor chips 6A, 6B are mounted on the fifth-layer unit wiring layer 12, through these process steps, as shown in FIG. 16. The semiconductor chips 6A, 6B are mounted by the flip chip method to high precision on the surface 12a of the fifth-layer unit wiring layer 12 formed to high precision. Meanwhile, in the semiconductor chip mounting process, the semiconductor chips 6A, 6B may be mounted on the fifth-layer unit wiring layer 12 by for example a face down mounting method, such as tape automated bonding (TAB) or beam lead bonding, instead of by the flip chip bonding.

Figure 17:
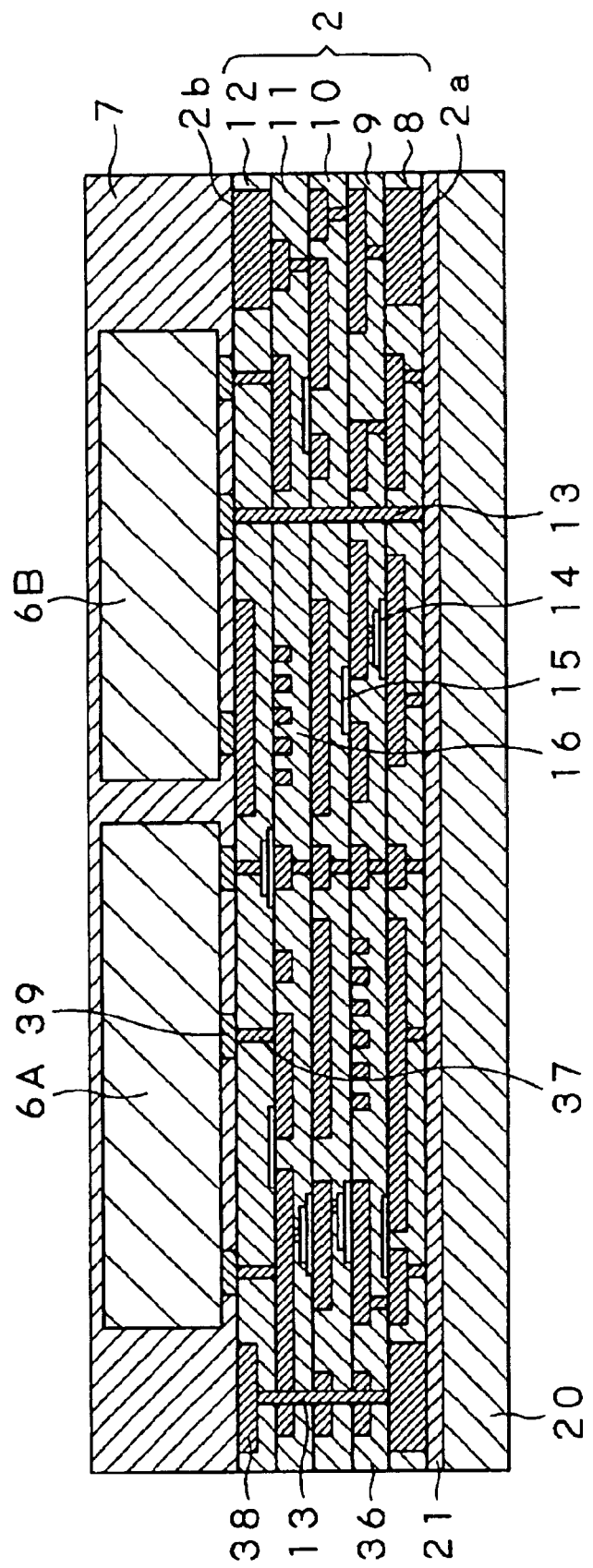
FIG. 17 illustrates a process for forming a sealing resin layer for sealing a semiconductor chip.

In the manufacturing process for the circuit module 1, a step of forming a sealing resin layer for sealing the semiconductor chips 6A, 6B by the sealing resin layer 7 is carried out as a post-step for the semiconductor chip mounting process. In this sealing resin layer forming step, the sealing resin layer 7 is formed by for example a transfer mold method or a printing method, for sealing the second major surface 2b of the multi-layer wiring section 2, in its entirety, inclusive of the semiconductor chips 6A, 6B, as shown in FIG. 17. For the sealing resin layer 7, a resin material with low thermosetting contraction ratio, such as epoxy resin, is used, whereby the stress due to warping or the like may not be produced in the first base substrate 20 following the curing.

Figure 18:
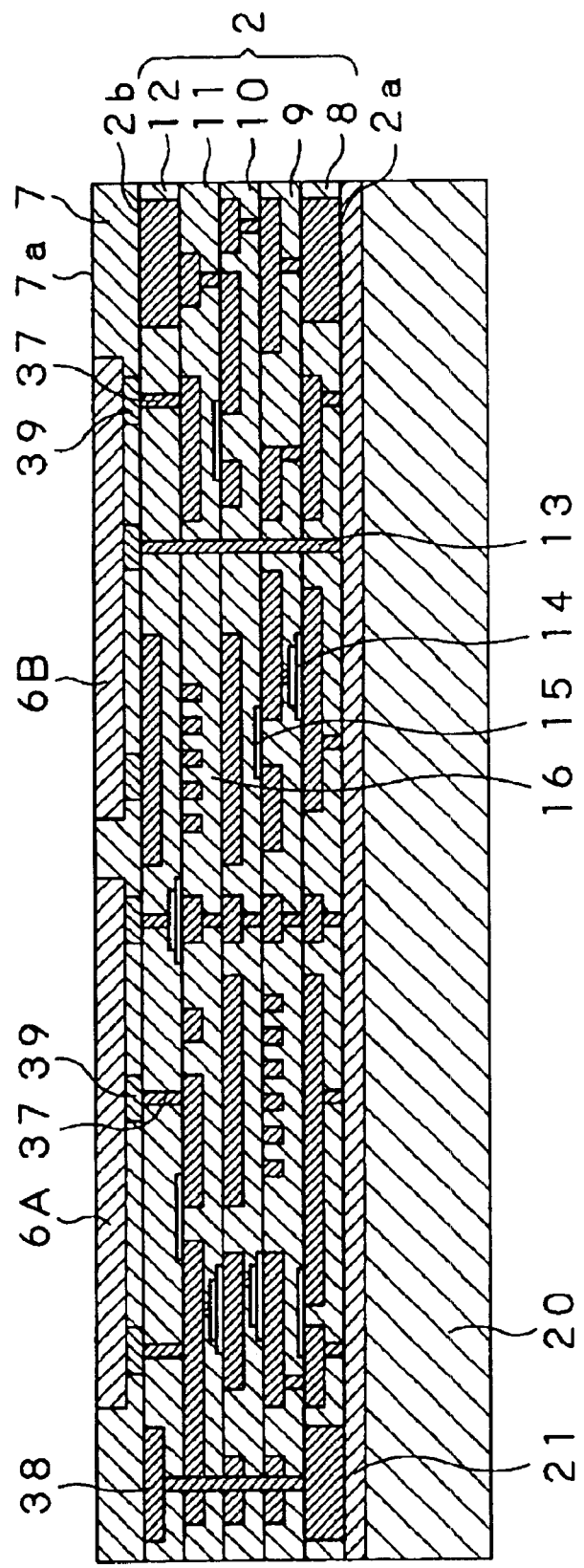
FIG. 18 illustrates a polishing process for polishing a sealing resin layer.

In the manufacturing process for the circuit module 1, the sealing resin layer 7 formed on the major surface 2b of the multi-layer wiring section 2 is polished to a predetermined thickness. The polishing process is by mechanical polishing, with the use of, for example, a grinder, a chemical polishing method by wet etching or CMP, which is the combination of the mechanical polishing and the chemical polishing. The semiconductor chips 6A, 6B as well as the sealing resin layer 7 are surface-polished to the maximum extent which does not obstruct the functions to reduce the thicknesses thereof as shown in FIG. 18. In the polishing process, the semiconductor chips 6A, 6B are polished, using the first base substrate 20 as a supporting substrate, as the semiconductor chips 6A, 6B are sealed with the sealing resin layer 7 such as to achieve maximum and accurate polishing without incurring damages to the semiconductor chips 6A, 6B such as edge defects.

Figure 19:
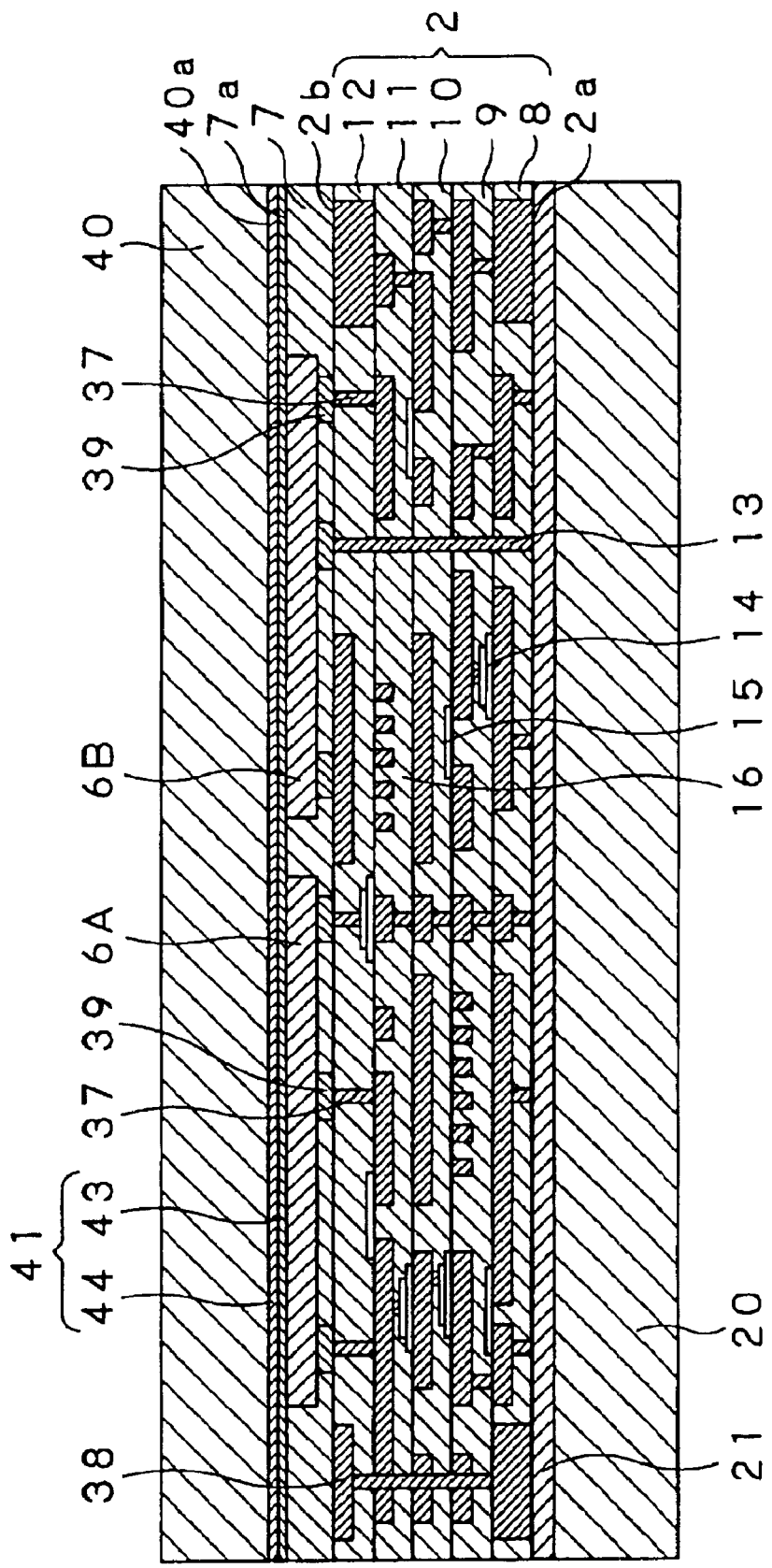
FIG. 19 illustrates a process for bonding a second base substrate.

In the manufacturing process for the circuit module 1, the second base substrate 40 is bonded via release layer 41 to the surface 7a of the sealing resin layer 7 polished as shown in FIG. 19. The second base substrate 40 has mechanical rigidity and has its major surface 40a as a planar surface. Since the second base substrate 40 forms a supporting substrate in the preset subsequent process of forming a connection terminal on the first major surface 2a of the multi-layer wiring section 2, as later explained, the second base substrate 40 is formed of a suitable substrate material exhibiting preset withstand characteristics against the processing contents. The second base substrate 40 may be formed of, for example, an Si substrate, a glass substrate or a quartz substrate. However, there is no particular limitation to the material type such that the second base substrate may be of any suitable substrate material type.

Similarly to the release layer 21 of the first base substrate 20, described above, the release layer 41 is formed by a thin metal film layer 42 of, for example, copper or aluminum, formed to a uniform thickness on the major surface 40a of the second base substrate 40 such as by the sputtering method or the CVD method, and a thin resin layer 43 of, for example, polyimide resin, formed to a uniform thickness on the thin metal film layer 42. The release layer 41 has its thin resin layer 43 bonded to the surface 7a of the sealing resin layer 7 so as to permit the multi-layer wiring section 2 to be peeled off from the second base substrate 40, during the peel-off step, as later explained, with the surface 7a of the sealing resin layer 7 as a peel-off surface.

Figure 20:
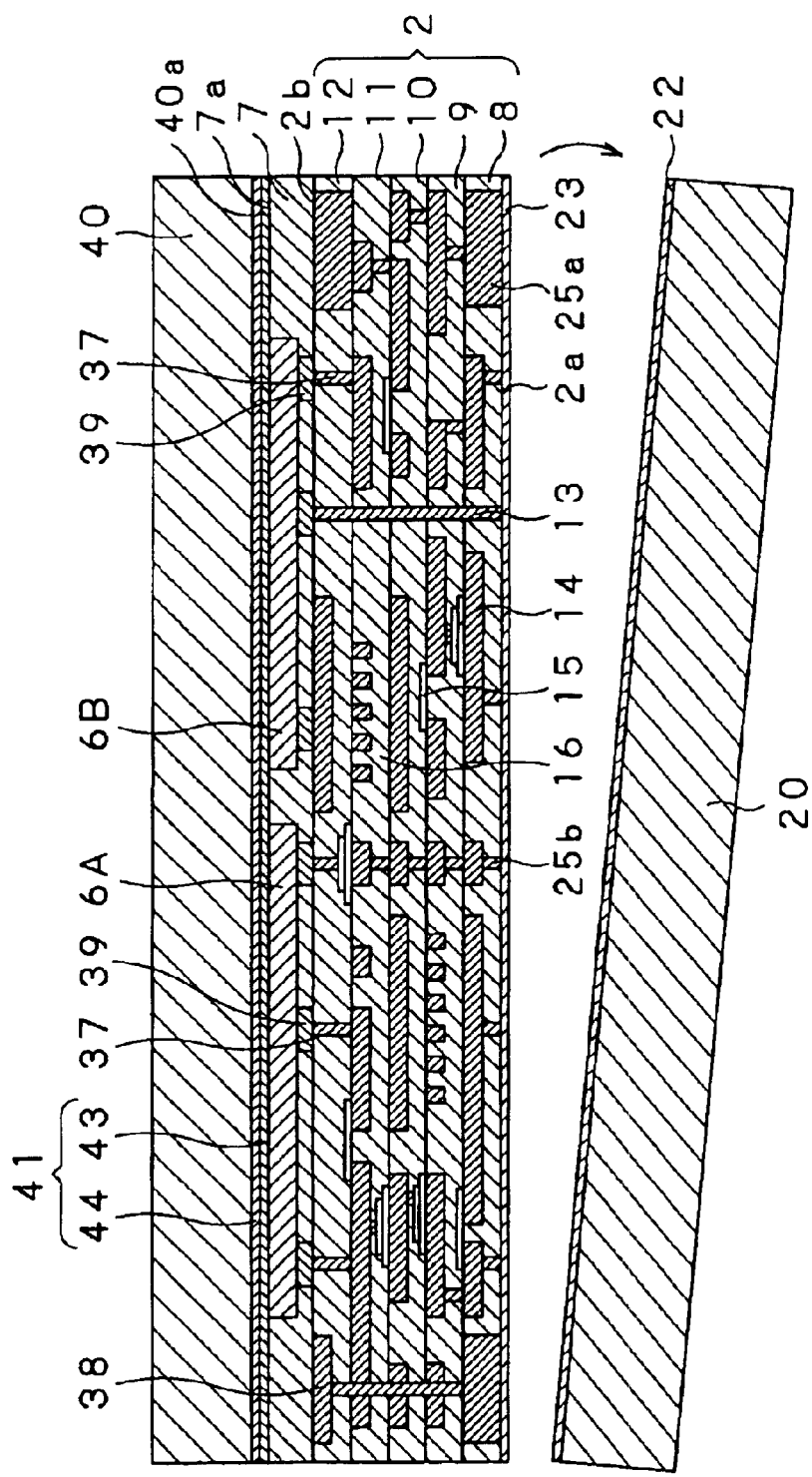
FIG. 20 illustrates a process of peeling a first base substrate.

In the manufacturing process of the circuit module 1, the peel-off step of peeling the first base substrate 20 from the multi-layer wiring section 2 is carried out, as shown in FIG. 20. In the pee-off step, a semi-finished product of the circuit module 1, obtained from the above-described respective process steps, is dipped in an acidic solution, such as hydrochloric acid. In the semi-finished product of the circuit module 1, peeling proceeds in the boundary surface between the thin metal film layer 22 and the thin resin layer 23, such that the multi-layer wiring section 2 is peeled off from the first base substrate 20 as the thin resin layer 23 is left on the first major surface 2a.

It is noted that, in the peel-off step, the multi-layer wiring section 2 is peeled off from the first base substrate 20 as e.g., the nitric acid solution dissolves the thin metal film layer 22 slightly so as to be intruded into a space between the thin metal film layer 22 and the thin resin layer 23 in case the semi-finished product of the circuit module 1 is dipped into the nitric acid solution. Thus, in the circuit module 1, a protective layer may be formed at the outset on the first-layer unit wiring layer 8. In the peel-off step, the multi-layer wiring section 2 may be peeled off from the first base substrate 20 by e.g., laser ablation.

In the manufacturing process for the circuit module 1, the portions of the thin resin film layer 23, left over on the first major surface 2a of the multi-layer wiring section 2, peeled off from the first base substrate 20 by the peel-off step as described above, are removed. The processing for removal is by for example the dry etching employing an oxygen plasma. This exposes to outside a connection terminal 25a or a land 25b formed in the first circuit pattern 25 of the first-layer unit wiring layer 8 in the multi-layer wiring section 2. Since the first-layer unit wiring layer 8 of the multi-layer wiring section 2 is formed on the planarized major surface 20a of the first base substrate 20 as described above, the exposed second surface 8b of this first-layer unit wiring layer 8 is also formed as the highly planarized surface.

Figure 21:
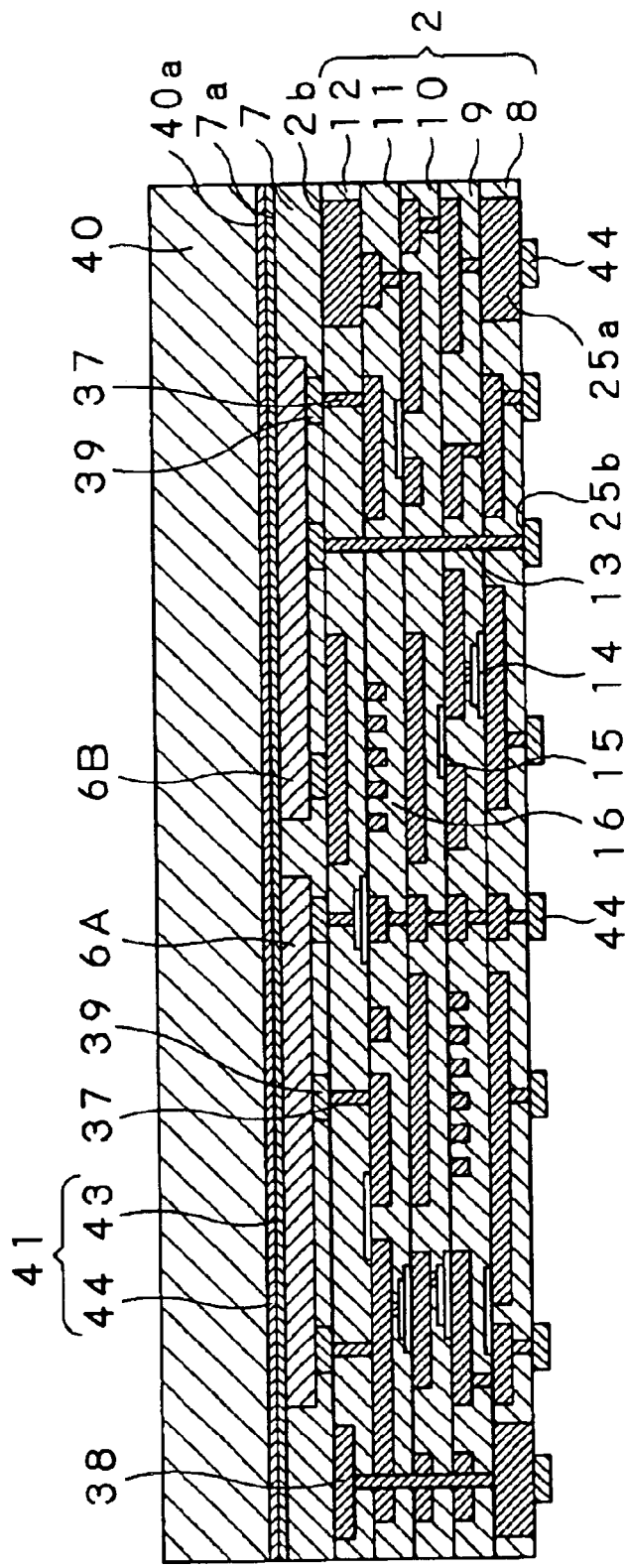
FIG. 21 illustrates a process of forming a connection terminal section.

In the manufacturing process of the circuit module 1, the processing for forming the terminal is carried out on the major surface 2a of the multi-layer wiring section 2. That is, in the multi-layer wiring section 2, solder bumps 44 for connection are mounted on the connection terminal 25a or the land 25b of the first-layer unit wiring layer 8 exposed as shown in FIG. 21. The solder bumps 44 form a connection material in mounting the circuit module 1 on the interposer 3. Thus, an Au—Ni layer may be formed on the surfaces of the solder bumps by for example the electrolytic plating or electroless plating. In the manufacturing process for the circuit module 1, the solder bumps 44 are mounted on the first-layer unit wiring layer 8 with high surface finish as the multi-layer wiring section 2 is maintained in a state free from flexure with the second base substrate 40 as a supporting substrate, as described above.

Figure 22:
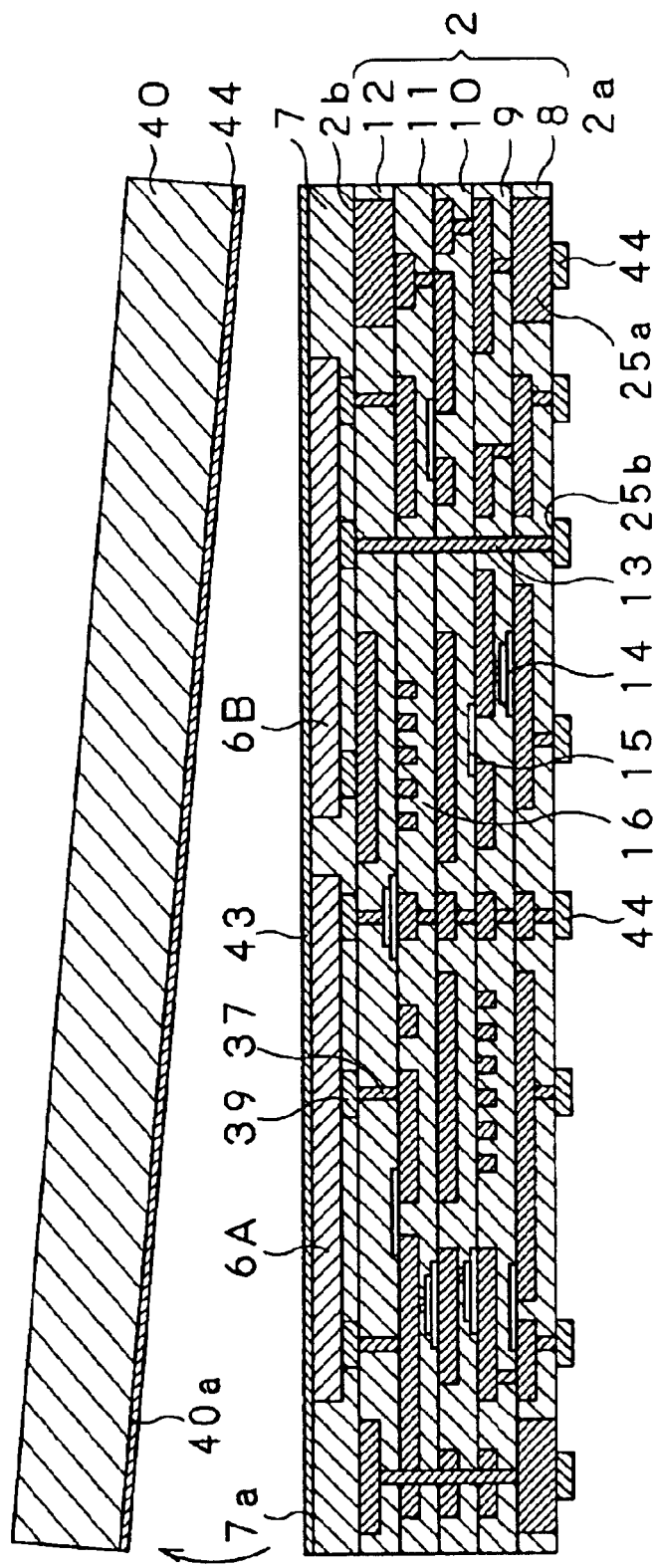
FIG. 22 illustrates a process of peeling a second base substrate.

In the manufacturing process for the circuit module 1, the step of peeling off the multi-layer wiring section 2 from the second base substrate 40 is carried out in the same way as in the above-described peel-off process for the first base substrate 20, as shown in FIG. 22. In the manufacturing process, the peel-off step of peeling the multi-layer wiring section 2 from the second base substrate 40 is carried out in the same way as in the above-described peel-off step for the first base substrate 20, as shown in FIG. 22. In the pee-off step, a semi-finished product of the circuit module 1 is dipped in an acidic solution, such as hydrochloric acid. That is, the semi-finished product of the circuit module 1 is peeled off in the boundary surface between the thin metal film layer 42 and the thin resin layer 43 of the release layer 41, such that the multi-layer wiring section 2 is peeled off from the first base substrate 20 as the thin resin layer 43 is left on the second major surface 2b. Moreover, in the manufacturing process for the circuit module 1, the thin resin layer 43 left on the second major surface 2b is removed by for example dry etching to produce the multi-layer wiring section 2 shown in FIG. 1.

Meanwhile, in the manufacturing process for the circuit module 1, base substrates 20, 40 larger in size are usually employed to produce a large number of circuit modules 1 interconnected via connection portions in a lump at a time. Thus, in the manufacturing process for the circuit module 1, the processing of cutting the connecting portions, interconnecting the respective multi-layer wiring sections 2, is carried out as a pre-process of the peel-off process from the second base substrate 40 described above. The respective multi-layer wiring sections 2 are severed from one another, however, these are maintained formed on the second base substrate 40. In the manufacturing process for the circuit module 1, the multi-layer wiring sections 2 are produced separated from one another by the above-described peel-off step.

It is noted that, at the time of the above-described cutting, cutting marks of curing the multi-layer wiring sections 2 by a cutter used are left on the major surface 40a of the second base substrate 40 thus detracting from planarity to render it impossible to re-use the second base substrate 40. Thus, a planar dummy layer of for example a synthetic resin may be provided at the outset between the second base substrate 40 and the release layer 41. The second base substrate 40 is subjected to cutting in a controlled manner so that the foremost part of the cutter will be halted by this dummy layer. After peeling off the respective multi-layer wiring sections 2, the dummy layer is removed and a new dummy layer is again formed. In the manufacturing process for the circuit module 1, the relatively expensive second base substrate 40 is re-used to lower the cost and to shorten the processing time.

Figure 23:
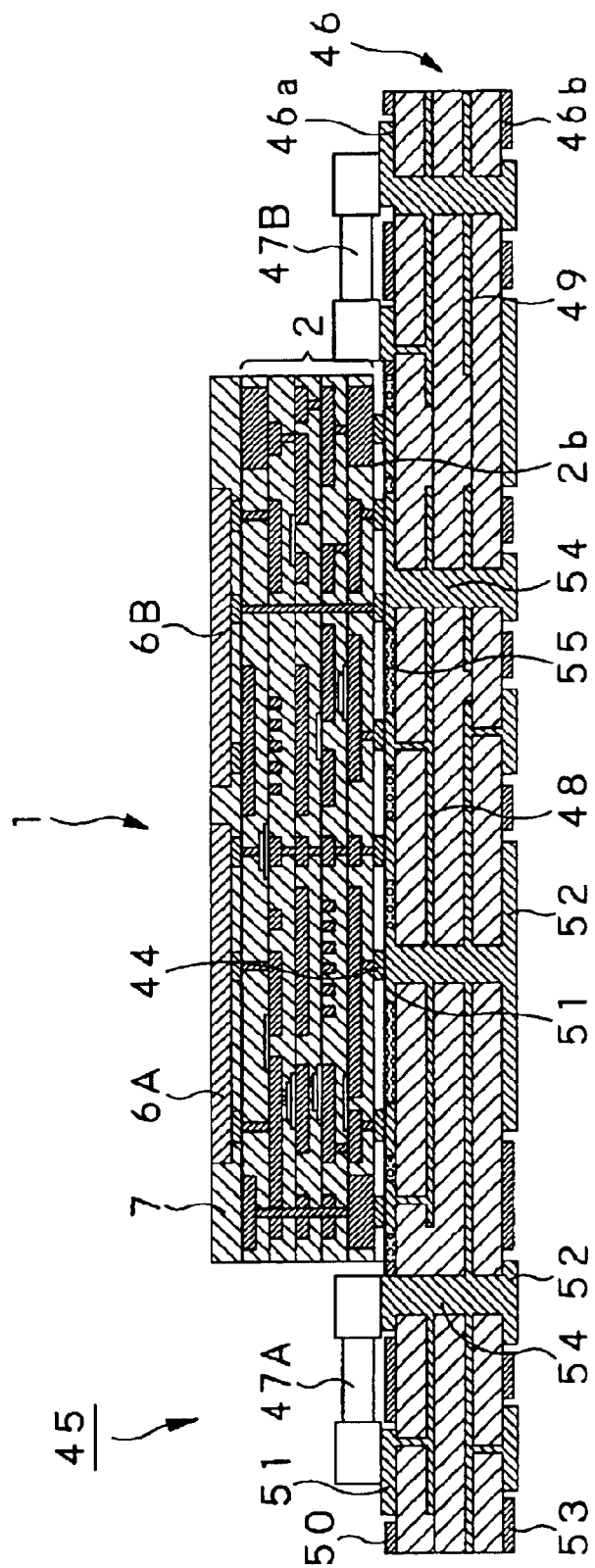
FIG. 23 is a longitudinal cross-sectional view showing essential portions of a digital communication module device carrying a multi-chip circuit module.

The circuit module 1, formed as described above, may be used as a mounting component part, mounted by face-down on the interposer 46, with the second surface 8b of the first-layer unit wiring layer 8 as the mounting surface, as shown in FIG. 23, as are other chip components 47A, 47B, for forming the digital circuit module device 45. The digital circuit module device 45 includes an interposer 46 manufactured by a routine multi-layer substrate manufacturing process. The interposer 46 has formed therein a power supply circuit pattern 48 and a ground pattern 49, and includes a large number of connection terminal sections 51 exposed from a protective layer 50 formed by e.g., a resist on a component part mounting surface 46a.

Meanwhile, the major surface of the interposer 46 opposite to the component part mounting surface 46a forms a loading surface 46b by which the interposer is loaded on the apparatus side substrate. A large number of connection terminal sections 52, through which signals or the power is supplied from the apparatus side, are formed on the loading surface 46b as well and a protective layer 53 is formed as a film such as to expose the connection terminal sections 52 to outside. In the interposer 46, the connection terminal sections 51 on the component part mounting surface 46a, a power supply circuit pattern 48 and a ground pattern 49, as inner layers, and the connection terminal sections 52 on the loading surface 46b, are interconnected via a large number of through-holes 54.

On the component part mounting surface 46a of the interposer 46, the circuit module 1 is loaded in position as the solder bumps 44 are in register with the connection terminals for the connection terminal sections 51. As the circuit module 1 has been loaded in position on the interposer 46, an under-fill 55 is charged into a space between the major surface 2b of the multi-layer wiring section 2 and the component part mounting surface 46a. In this state, the interposer 46 is supplied to for example a reflow solder vessel, whereby the respective solder bumps 44 are solidified and secured to the connection terminal sections 51 to mount the circuit module 1 to produce the digital circuit module device 45.

In the digital circuit module device 45, a power supply circuit or the ground connection is provided on the side thereof towards the interposer 46, and is supplied with low speed signals, such as control signals, while high-speed signals across the semiconductor chips 6A, 6B are processed within the circuit module 1. In the digital circuit module device 45, passive devices that cannot be formed within the circuit module 1 are mounted, along with the circuit module 1, on the component part mounting surface 46a of the interposer 46, as described above, by way of complementation with a chip component 47 having a diminished wiring length. The digital circuit module device 45, provided with the multi-functional circuit module 1 with a reduced thickness, may be reduced in thickness and functionally diversified in its entirety. With the digital circuit module device 45, in which the power supply circuit pattern 48 and the ground pattern 49 with a sufficient area are provided within the interposer 46, it is possible to provide power supply with high regulation.

Figure 24:
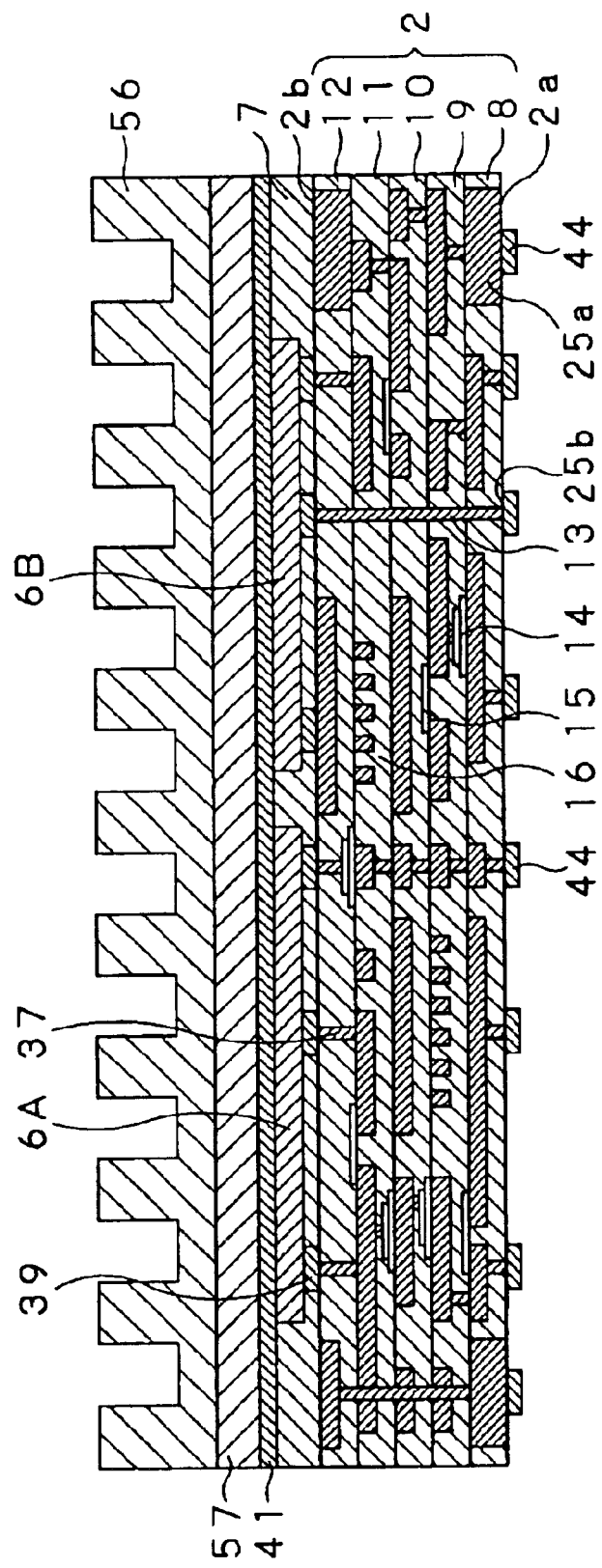
FIG. 24 is a longitudinal cross-sectional view showing essential portions of a multi-chip circuit module provided with a heat radiating member.

Meanwhile, in the manufacturing process for the circuit module 1, the second base substrate 40, formed of any suitable substrate material, is bonded via release layer 41 to the surface 7a of the sealing resin layer 7 for forming the terminal on the major surface 2a of the multi-layer wiring section 2, as described above. In the manufacturing process for the circuit module 1, the second base substrate 40 is peeled off after the terminal formation. In the circuit module 1, the second base substrate 40 may be left over on the second major surface 2b of the multi-layer wiring section 2 for use as a loading component for other component parts. In the use state of the circuit module 1, heat may be evolved from the semiconductor chips 6A, 6B. Thus, the second base substrate 40 is used as a loading member for a heat radiating member, as shown in FIG. 24.

That is, in the circuit module 1, a second base substrate 57, formed of a substrate material with high thermal conductivity, such as a resin material mixed with a metal material or metal powders, such as aluminum powders, is used. In the circuit module 1, the second base substrate 57 is not peeled off but is left over in situ on the major surface 2b of the multi-layer wiring section 2, and a heat radiating member 56, such as a heat sink, is secured to the major surface of this second base substrate 57. In the circuit module 1, the heat evolved from the semiconductor chips 6A, 6B is efficiently transmitted to the second base substrate 57 so as to be radiated through the second base substrate 57 to the heat radiating member 56. Thus, with the circuit module 1, signal processing may be carried out in stability without such inconvenience as deteriorated characteristics due to heat radiated from the semiconductor chips 6A, 6B.

In the circuit module 1, the semiconductor chips 6A, 6B are mounted on the major surface 2b of the multi-layer wiring section 2, as described above. As a modification, a circuit module 60 of the double side mounting type, shown in FIG. 25, includes plural second semiconductor chips 61A, 61B mounted on the first major surface 2a of the multi-layer wiring section 2 as well, with the second base substrate 40 as a supporting substrate. In the circuit module 60, in which the multi-layer wiring section 2 is made up by a plural number of unit wiring layers 8 to 12, layered together to high precision, and having planarized first and second major surface s 2a, 2b, a plural number of the first semiconductor chips 6A, 6B are mounted on the second major surface 2b, while a plural number of the second semiconductor chips 61A, 61B are also mounted to high accuracy on the first major surface 2a.

The circuit module 60, in which the plural first semiconductor chips 6A, 6B and the plural second semiconductor chips 61A, 61B are mounted not on the sole major surface but in a facing relationship along the thickness, may be reduced in size and in thickness. In the circuit module 60, the first-layer unit wiring layer 8 to the fifth-layer unit wiring layer 12, making up the multi-layer wiring section 2, are formed each to a thickness on the order of 5 μm, and are passed through by a via 13 a few μm in diameter by way of providing inter-layer interconnection by a so-called via-on-via structure. Thus, in the circuit module 60, the wiring length may be reduced not only across the first semiconductor chips 6A, 6B or across the plural second semiconductor chips 61A, 61B but also across the first and second semiconductor chips, thus assuring a high function and a high processing speed.

Figure 25:
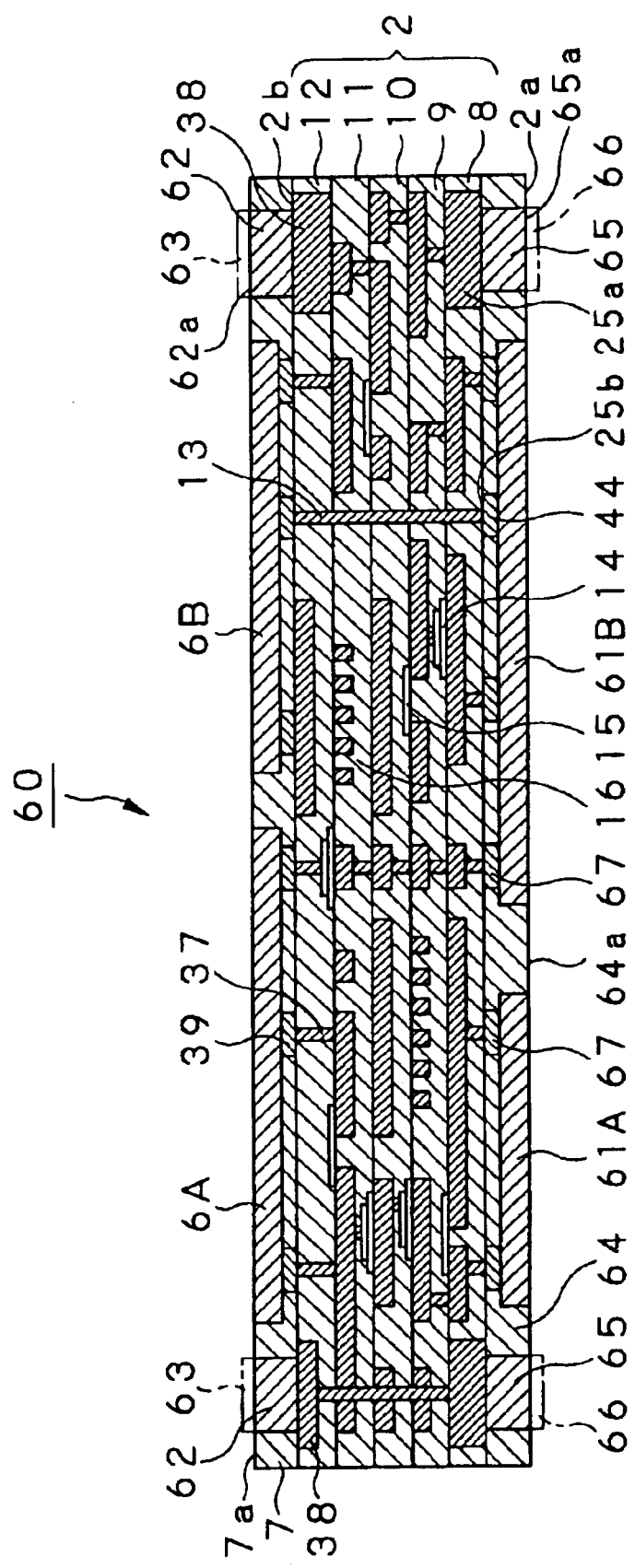
FIG. 25 is a longitudinal cross-sectional view showing essential portions of a multi-chip circuit module, mounting a semiconductor chip on each of both surfaces of a multi-layer wiring section, shown as a second embodiment of a multi-chip circuit module according to the present invention.

In the circuit module 60, a large number of first connecting terminal sections 62 are provided outside the mounting area for the first semiconductor chips 6A, 6B on the second major surface 2b of the multi-layer wiring section 2 having mounted thereon the semiconductor chips 6A, 6B, as shown in FIG. 25. In the circuit module 60, the first connecting terminal sections 62 are polished, similarly to the first semiconductor chips 6A, 6B, so as to be reduced in thickness, such that planarized surfaces 62a thereof are exposed to outside flush with the first sealing resin layer 7, as will be explained subsequently in detail. The first semiconductor chips 6A, 6B of the circuit module 60 are polished to a thickness on the order of approximately 0.05 mm as are the first connecting terminal sections 62. Meanwhile, the respective surfaces of the first connecting terminal sections 62 may be plated with e.g., gold to form a connection terminal 63 as necessary.

On the first major surface 2a of the multi-layer wiring section 2 of the circuit module 60, the second semiconductor chips 61A, 61B, sealed by the second sealing resin layer 64, are mounted, while a large number of second connection terminal sections 65 are mounted outside the mounting region of these second semiconductor chips 61A, 61B. Similarly to the first semiconductor chips 6A, 6B and the first connecting terminal sections 62, the second semiconductor chips 61A, 61B and the second connection terminal sections 65 of the circuit module 60 are reduced in thickness and planarized by polishing the second sealing resin layer 64 and are exposed to outside flush with the second sealing resin layer 64. The circuit module 60 in its entirety is reduced in thickness to approximately 150 μm by polishing the second semiconductor chips 61A, 61B and the second connection terminal sections 65 to a thickness of approximately 0.05 mm. Meanwhile, the respective surfaces of the second connecting terminal sections 65 may be plated with e.g., gold to form a connection terminal 66 as necessary.

The circuit module 60 is connected to an interposer side signal input/output terminal of, for example, a control substrate, via first connecting terminal sections 62 or second connecting terminal sections 65 for input/output of e.g., control signals. The circuit module 60 is supplied with low speed signals, such as control signals, power or ground signals, while high-speed signals across the first semiconductor chips 6A, 6B and the second semiconductor chips 61A, 61B are processed within the multi-layer wiring section 2. The circuit module 60 is provided with the multi-layer wiring section 2 reduced in thickness and which has planarized first and second major surfaces 2a and 2b. Thus, the circuit module 60 in its entirety is reduced in thickness and has diversified functions. It is moreover possible to form an impedance-controlled circuit pattern such as a micro-strip line comprised of a ground connection sandwiched between upper and lower layers to guarantee power supply with high regulation.

The manufacturing process of the circuit module 60, described above, is hereinafter explained by referring to FIGS. 26 to 33. As for other structures, the circuit module 60 is the same as the circuit module 1 described above and hence the corresponding parts are depicted by the same reference numerals and the detailed explanation is omitted for simplicity.

Figure 26:
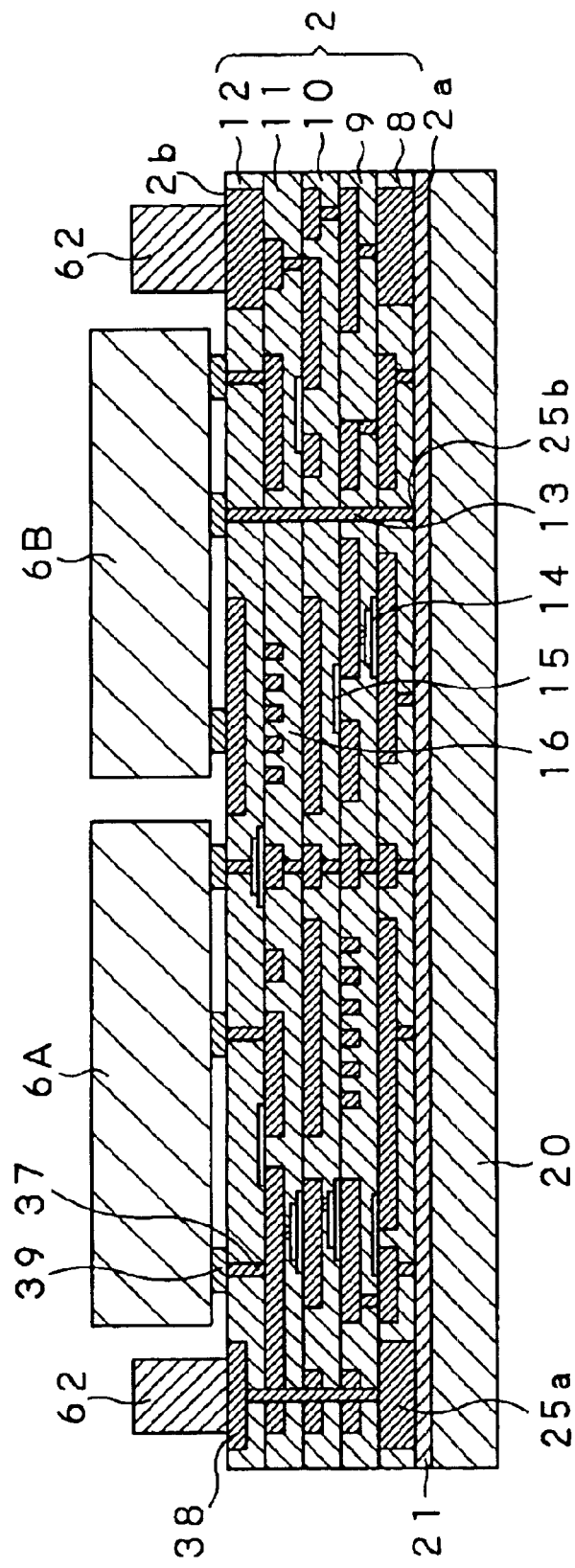
FIG. 26 illustrates a manufacturing process for a multi-chip circuit module and specifically showing the process of mounting a semiconductor chip and a connection terminal section on a second major surface of the multi-layer wiring section.

In the manufacturing process for the circuit module 60, solder bumps 39 are mounted on the electrode pads 37 formed on the fifth-layer unit wiring layer 12, as multi-layer wiring section 2 has been formed on the first base substrate 20, shown in FIG. 15, in the manufacturing process for the circuit module 1, described above. In this state, the first semiconductor chips 6A, 6B are mounted by for example a flip-chip mounting method. In the manufacturing process for the circuit module 60, the first semiconductor chips 6A, 6B are mounted, and the first connecting terminal sections 62 are formed on the connection terminal section 38 formed on the fifth-layer unit wiring layer 12 of the multi-layer wiring section 2, as shown in FIG. 26. The first connecting terminal sections 62 is made up by Cu bumps, formed to an increased thickness by applying Cu plating to the exposed connection terminal section 38. The first connecting terminal section 62 may be formed e.g., by bonding a solder ball on or by applying solder plating to the connection terminal section 38.

Figure 27:
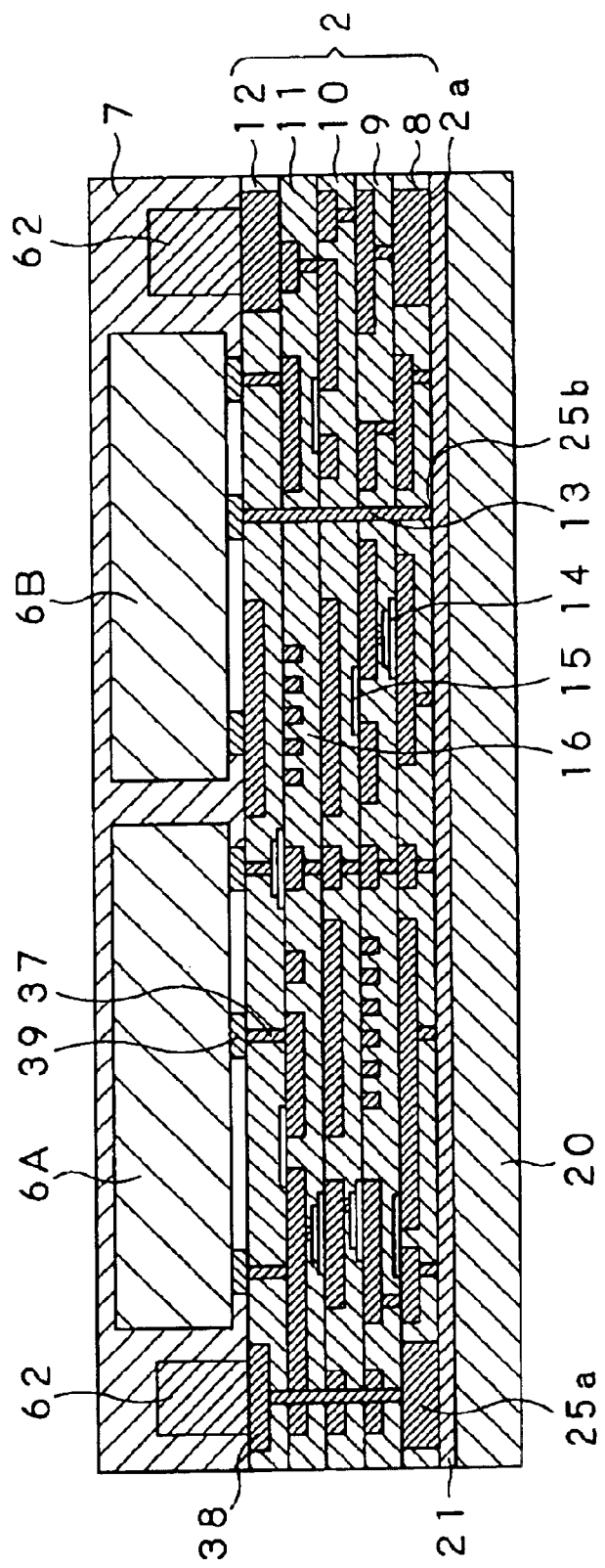
FIG. 27 illustrates a process of forming a first sealing resin layer used for sealing the first semiconductor chip and the first connection terminal section.
Figure 28:
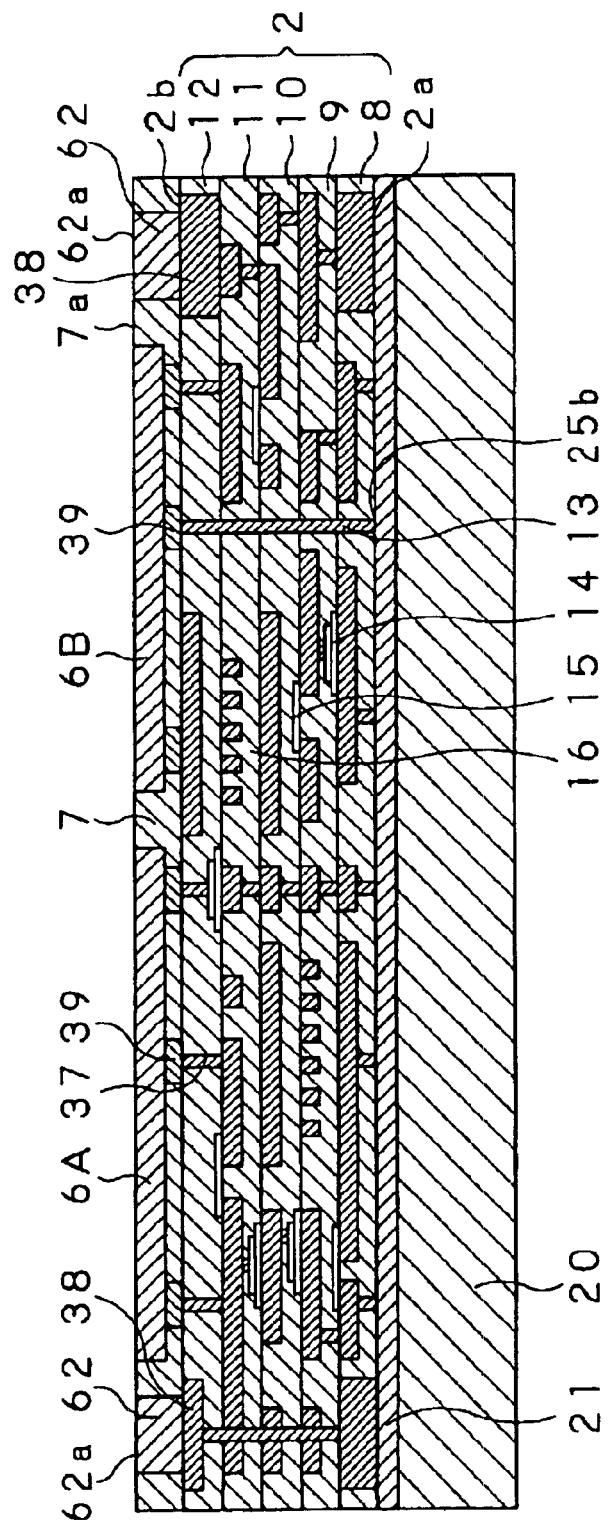
FIG. 28 illustrates a process for polishing the sealing resin layer.

In the manufacturing process for the circuit module 60, a first sealing resin layer forming step of sealing the first semiconductor chips 6A, 6B and the first connecting terminal sections 62 by the first sealing resin layer 7 is carried out, as shown in FIG. 27, as a post-processing step to the step of mounting the first semiconductor chips 6A, 6B. As in the manufacturing method for the circuit module 1, the first sealing resin layer forming step is carried out in such a manner that the first sealing resin layer 7 is formed by for example a transfer molding method or a printing method for sealing the entire major surface 2b of the multi-layer wiring section 2, inclusive of the first semiconductor chips 6A, 6B and the first connecting terminal sections 62, to a predetermined thickness.

In the manufacturing method for the circuit module 60, a polishing step is carried out for polishing the first sealing resin layer 7, formed on the second major surface 2b of the multi-layer wiring section 2 to a preset thickness. In the polishing process, carried out by a mechanical polishing method, a chemical polishing method by wet etching, or by CMP, which is the combination of the mechanical and chemical polishing methods, the first semiconductor chips 6A, 6B and the first connecting terminal sections 62 are polished to a planar surface. The first semiconductor chips 6A, 6B are surface-polished to the maximum extent insofar as the functions thereof are not obstructed. The first semiconductor chips are reduced in thickness in this manner so as to be flush with the surface 7a of the first sealing resin layer 7. Similarly to the first semiconductor chips 6A, 6B, the first connecting terminal sections 62 are reduced in thickness, as are the first semiconductor chips 6A, 6B, to form a surface flush with the surface 7a of the first sealing resin layer 7.

Figure 29:
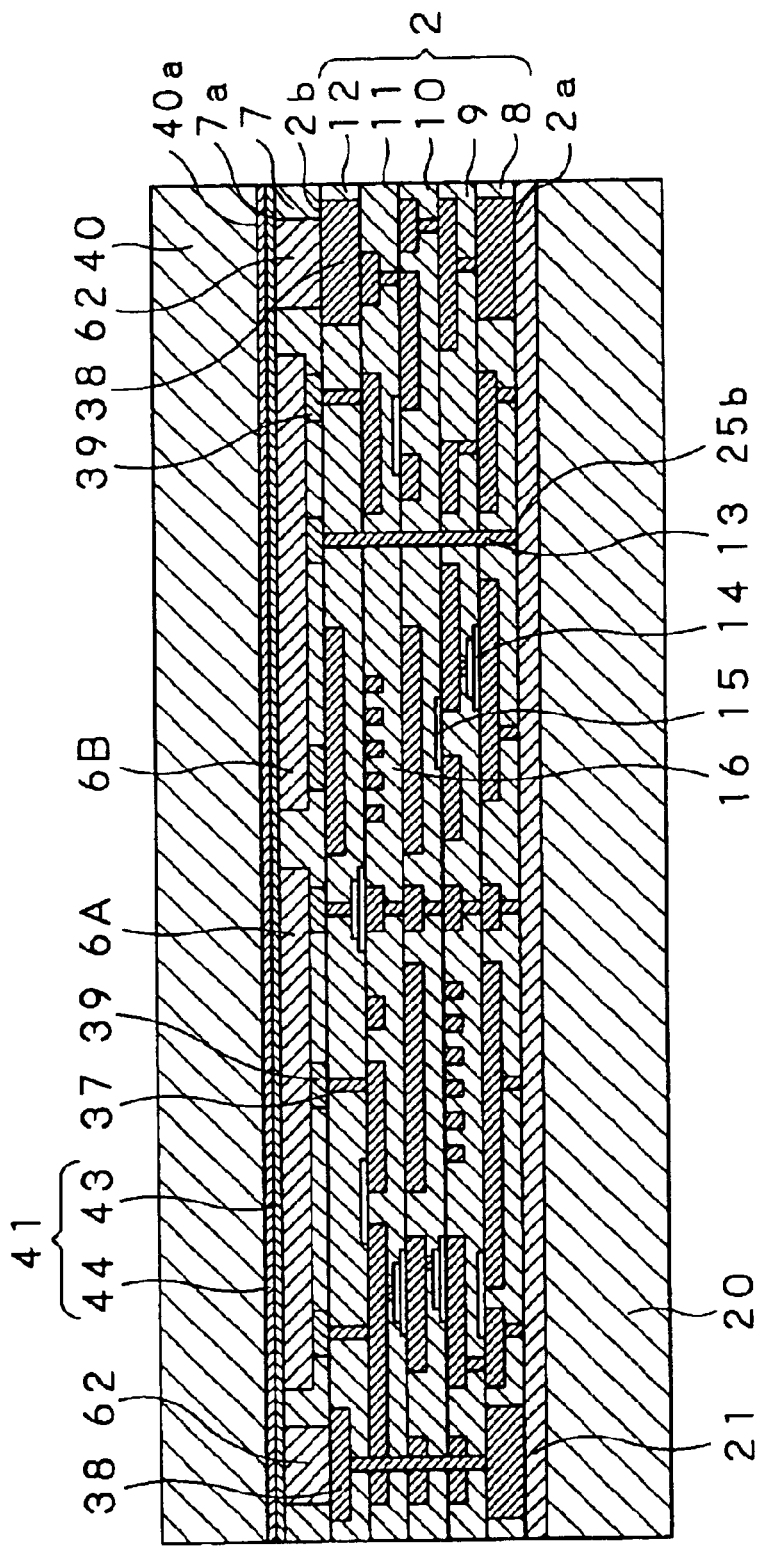
FIG. 29 illustrates a process for bonding the second base substrate.

In the manufacturing method of the circuit module 60, a bonding step is then carried out for bonding the second base substrate 40 through a release layer 41 to the surface 7a of the first sealing resin layer 7, planarized by the polishing processing, as shown in FIG. 29. The second base substrate 40, used as a supporting substrate in carrying out preset processing on the first major surface 2a of the multi-layer wiring section 2, as later explained, has its major surface 40a planarized and endowed with mechanical toughness. Similarly to the release layer 21 of the first base substrate 20, the release layer 41 is made up by a thin metal film layer 42, formed to a uniform thickness on the major surface 40a of the second base substrate 40 by e.g., the sputtering method or by the CVD method, and a thin resin film layer 43 formed to a uniform thickness on the thin metal film layer 42 by for example a spin coating method. In the peel-off layer 41, the thin resin film layer 43 is bonded to the surface 7a of the first sealing resin layer 7 and, in the peel-off process, as later explained, the multi-layer wiring section 2 is peeled off from the second base substrate 40, with the surface 7a as the peel-off surface.

Figure 30:
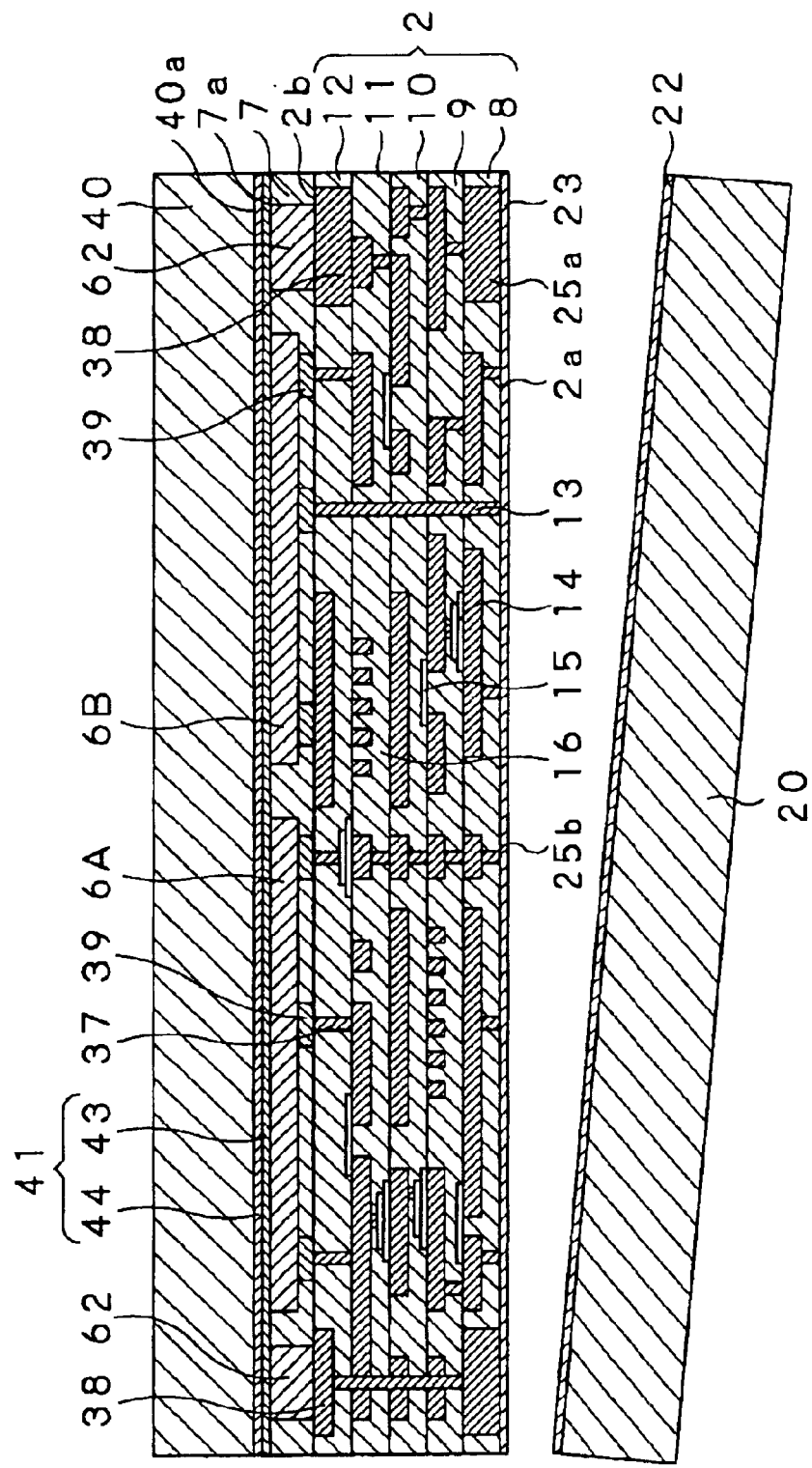
FIG. 30 illustrates a process for peeling a first base substrate.
Figure 31:
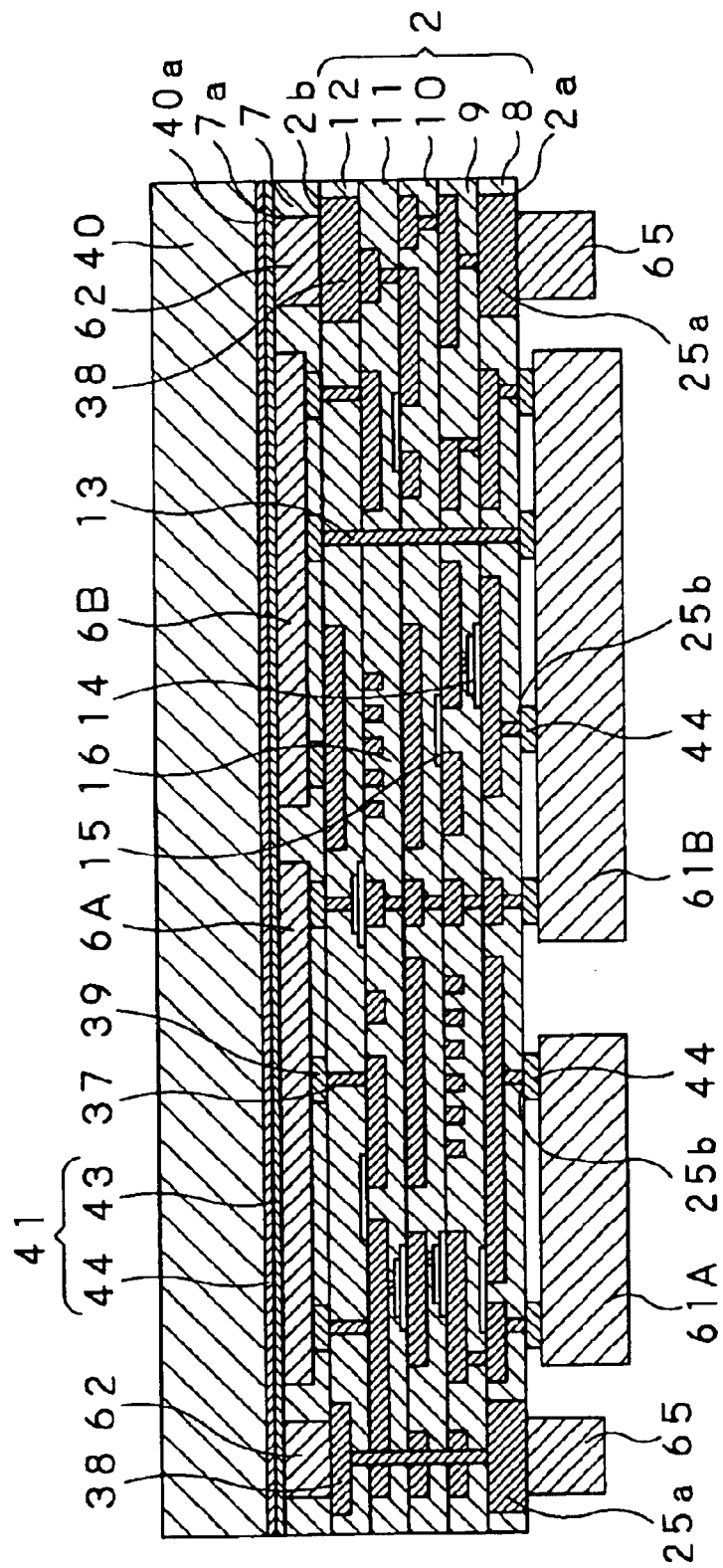
FIG. 31 illustrates a process for forming a sealing resin layer for sealing the second semiconductor chip and the second connection terminal section on the first major surface of the multi-layer wiring section.
Figure 32:
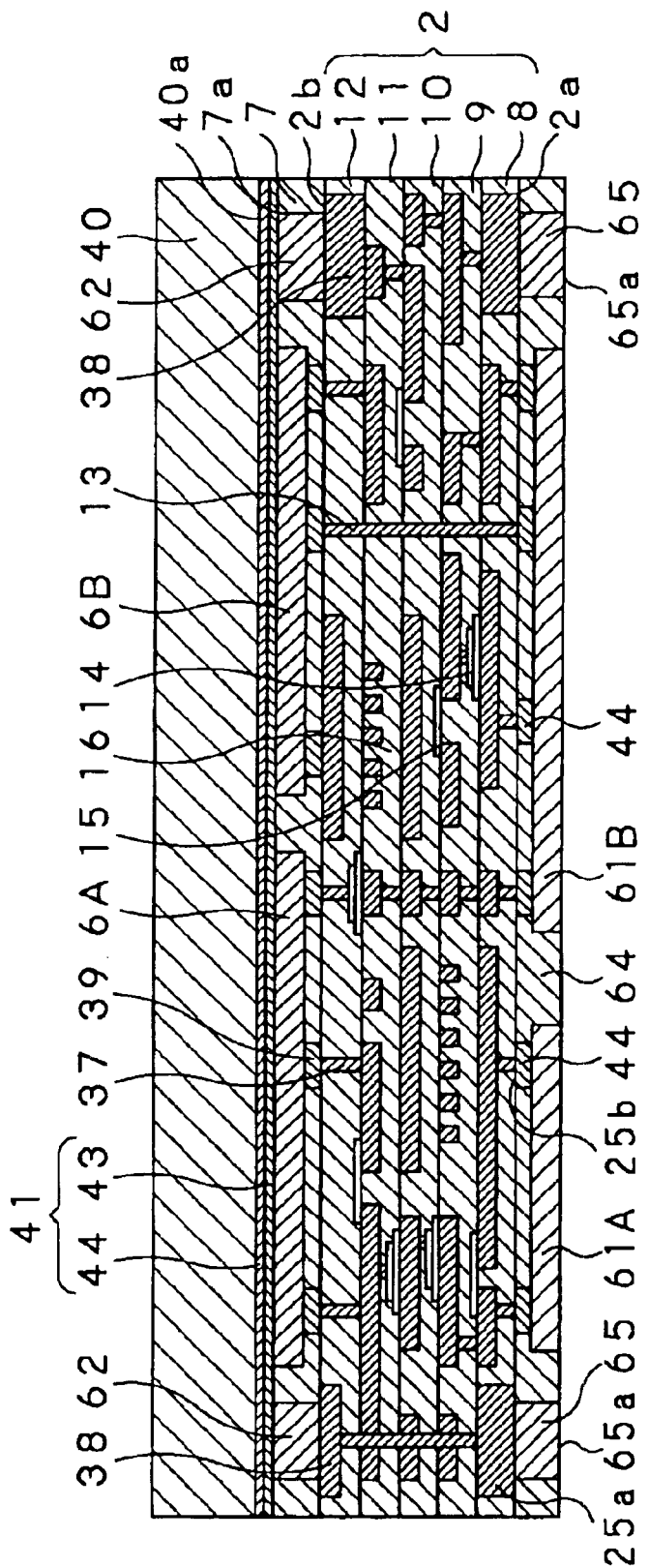
FIG. 32 illustrates the process for forming a second sealing resin layer for sealing the second semiconductor chip and the second connection terminal section, and specifically showing the second sealing resin layer in the polished state.
Figure 33:
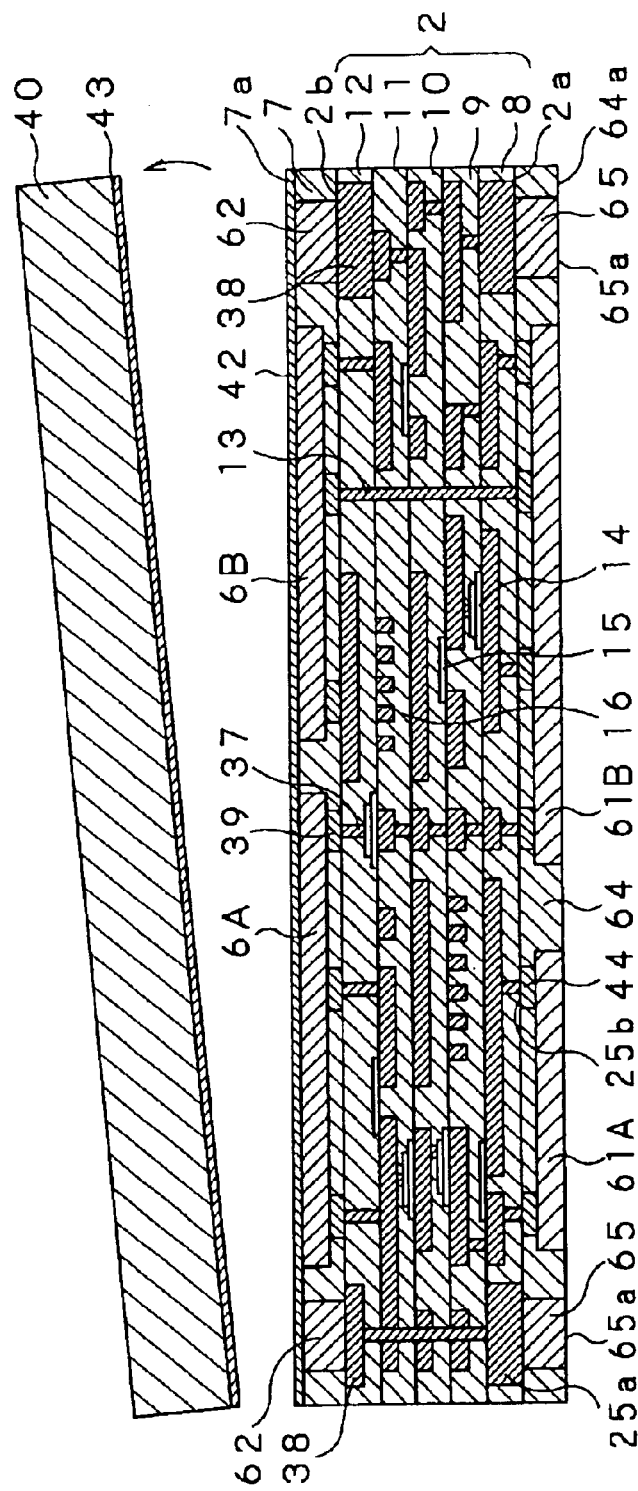
FIG. 33 illustrates the process of peeling the second base substrate.

In the manufacturing process for the circuit module 60, the peel-off step of peeling the first base substrate 20 from the multi-layer wiring section 2 is carried out after bonding the second base substrate 40. In the peel-off process, the side towards the first base substrate 20 of the circuit module 60 is dipped in an acidic solution of for example, hydrochloric acid to peel off only the first base substrate 20 from the multi-layer wiring section 2. In the peel-off state, the peel-off proceeds on a boundary surface between the thin metal film layer 22 and the thin resin film layer 23 of the release layer 21, such that, as shown in FIG. 30, the multi-layer wiring section 2 is peeled off from the first base substrate 20 as the thin resin film layer 23 is left on the first major surface 2a. Meanwhile, the peel-off process is carried out such that the acidic solution is not allowed to flow towards the second base substrate 40. The peel-off process may be carried out by peeling off the multi-layer wiring section 2 from the first base substrate 20 by laser ablation. The first base substrate 20 may be re-used by re-forming the release layer 21.

In the manufacturing process for the circuit module 60, the second base substrate 40 operates as a supporting substrate. Thus, in the manufacturing process for the circuit module 60, the processing for removing or polishing the thin resin film layer 23 applied to the first major surface 2a of the multi-layer wiring section 2 may be carried out without damaging the multi-layer wiring section 2.

In the manufacturing process for the circuit module 60, the thin resin film layer 23 left on the first major surface 2a of the multi-layer wiring section 2, peeled off from the first base substrate 20 by the above-described peel-off process, is removed by for example the dry etching by an oxygen plasma. In the manufacturing process for the circuit module 60, the second semiconductor chips 61A, 61B and the second connecting terminal sections 65 are mounted on the connection terminal section 25a or the land 25b formed in the first circuit pattern 25 of the first-layer unit wiring layer 8, exposed to outside by the processing of removing the thin resin film layer 23. The second semiconductor chips 61A, 61B are mounted on the first major surface 2a of the multi-layer wiring section 2 by e.g., a flip chip mounting method by mounting the solder bumps 44 on the lands 25b. The second connecting terminal sections 65 are formed by applying Cu plating to the connection terminal sections 25a.

In the manufacturing process for the circuit module 60, a second sealing resin layer forming process of sealing the second semiconductor chips 61A, 61B and the second connecting terminal sections 65 by the second sealing resin layer 64 is carried out. In the second sealing resin layer forming step, as in the first sealing resin layer forming step, a second sealing resin layer 64, sealing the entire first major surface 2a of the multi-layer wiring section 2, inclusive of the second semiconductor chips 61A, 61B and the second connecting terminal sections 65 is formed by, for example, the transfer mold method or by the printing method, to a predetermined thickness.

In the manufacturing process for the circuit module 60, the polishing process of polishing the second sealing resin layer 64 to a predetermined thickness is similarly performed. With the polishing process, which may be carried out as for example the mechanical polishing method by a grinder, a chemical polishing method by wet etching, or by CMP employing the mechanical polishing method and the chemical polishing method, the second semiconductor chips 61A, 61B and the second connecting terminal sections 65 are polished along with the second sealing resin layer 64 to a thin thickness, while the surface 64a of the second sealing resin layer 64 is planarized. The second semiconductor chips 61A, 61B are surface-polished to the maximum extent insofar as the functions thereof are not obstructed. The second semiconductor chips 61A, 61B are reduced in thickness in this manner so as to be flush with the surface 64a of the second sealing resin layer 64. The second connecting terminal sections 65 is also reduced in thickness and, similarly to the second semiconductor chips 61A, 61B, forms a surface flush with the surface 64a of the second sealing resin layer 64. With the polishing process, high precision polishing is possible by polishing the second sealing resin layer 64, using the second base substrate 40 as a supporting substrate.

In the manufacturing process for the circuit module 60, the peel-off process of peeling the second base substrate 40 from the multi-layer wiring section 2 by the above-described process steps is carried out. In the pee-off step, a semi-finished product of the circuit module 60 is dipped in an acidic solution, such as hydrochloric acid, to peel off the second base substrate 40 from the multi-layer wiring section 2. In the peel-off process, peel-off proceeds in the boundary surface between the thin metal film layer 42 and the thin resin layer 43 of the release layer 41, such that the multi-layer wiring section 2 is peeled off from the second base substrate 40 as the thin resin layer 43 is left on the first major surface 2b of the multi-layer wiring section 2. It is noted that the second base substrate 40 may be peeled off from the multi-layer wiring section 2 by e.g., laser ablation.

In the manufacturing process for the circuit module 60, the thin resin film layer 43 left on the first major surface 2a of the multi-layer wiring section 2, peeled off from the second base substrate 40 by the above-described peel-off process, is removed by for example the dry etching by an oxygen plasma. In the manufacturing process for the circuit module 60, base substrates 20, 40 larger in size are usually employed to produce a large number of circuit modules 60 interconnected via connection portions in a lump at a time. Thus, in the manufacturing process for the circuit module 60, the processing of cutting the connecting portions, interconnecting the respective multi-layer wiring sections 2, is carried out as a pre-process for the peel-off process from the second base substrate 40 in order to sever the respective circuit modules 60 from one another.

Figure 34:
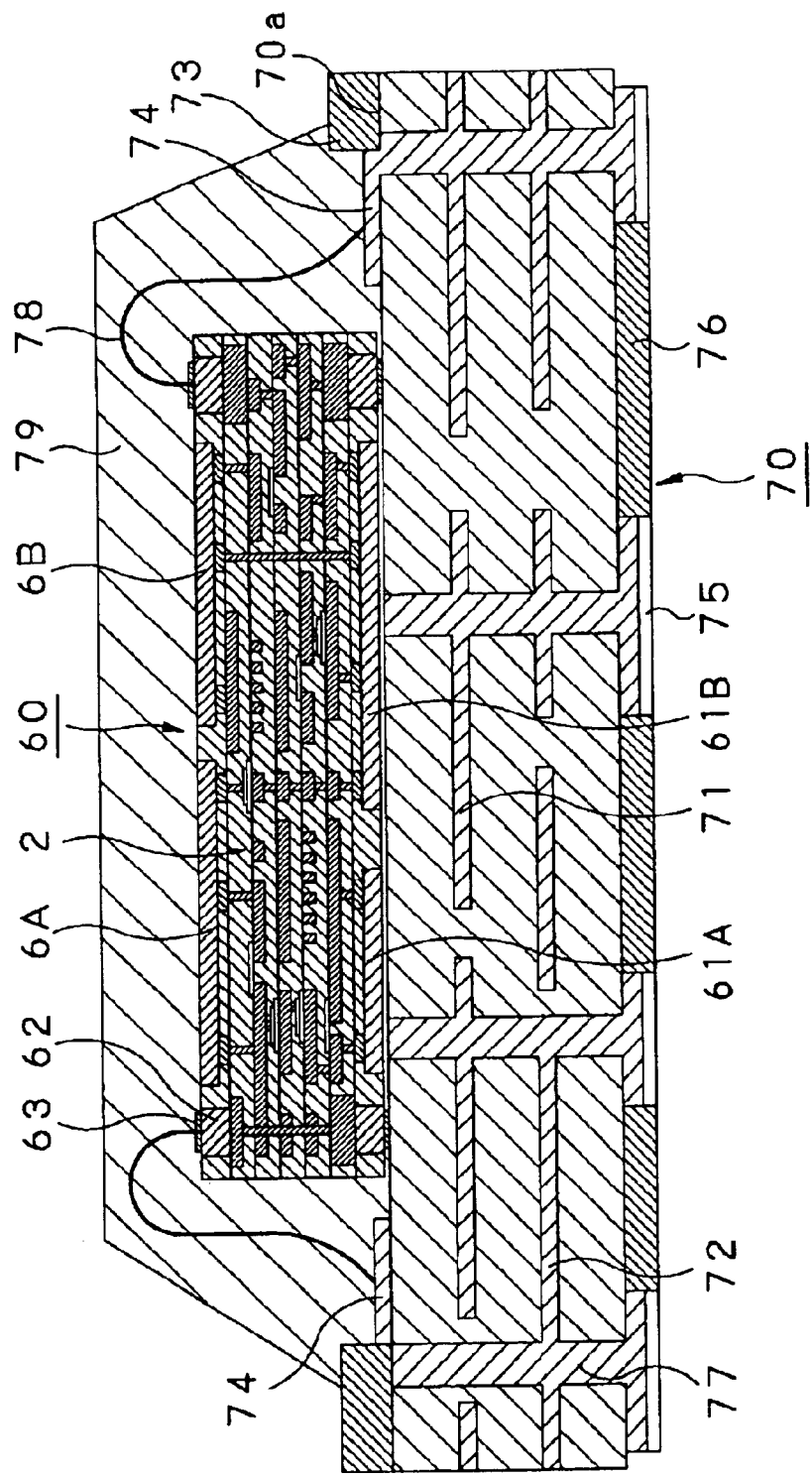
FIG. 34 is a longitudinal cross-sectional view showing essential portions of the digital circuit module device and specifically showing the mounting state of the multi-chip circuit module on an interposer by a wire bonding method.
Figure 35:
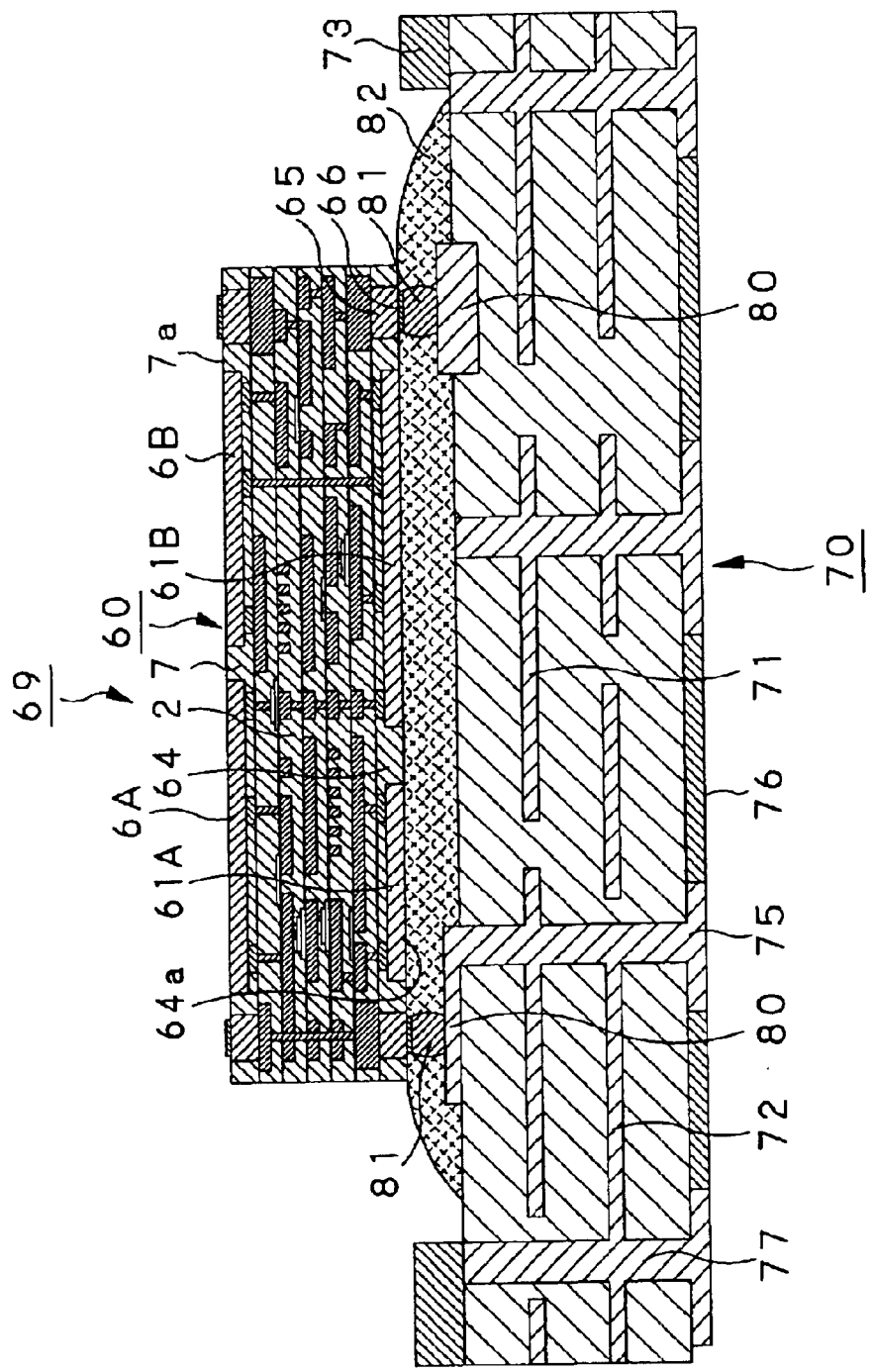
FIG. 35 is a longitudinal cross-sectional view showing essential portions of the digital circuit module device and specifically showing the mounting state of the multi-chip circuit module on an interposer by a face-down method.

Similarly to the circuit module 1, the circuit module 60, prepared by the above-described steps, is used as a component part mounted on the interposer 70, to form a digital circuit module device 68, for which the wiring has been made by the wire bonding method shown in FIG. 34, or a digital circuit module device 69, for which the wiring has been made by the face-down method shown in FIG. 35. The circuit module 60 may be mounted on the interposer 70 with the surface 7a of the first sealing resin layer 7 or with the surface 64a of the second sealing resin layer 64 as a mounting surface. The circuit module 60 may be mounted by any other suitable method on the interposer 70 or on other suitable circuit substrates.

The interposer 70 is a component part similar to the interposer 46 used for the digital circuit module device 45. Specifically, it is prepared by an ordinary multi-layer substrate producing process and has formed therein a power supply circuit pattern 71 and a ground pattern 72. The interposer 70 has a large number of lands 74 formed exposed from a protective layer 73 formed by e.g., a resist on a component part mounting surface 70a. The major surface of the interposer 70 opposite to the component part mounting surface 70a forms a loading surface 70b loaded on e.g., a substrate on the apparatus side. A large number of connection terminal sections 75, supplied with signals or power from the side apparatus, are formed on the loading surface 70b of the interposer 70 as well. In addition, a protective layer 76 is formed such as to expose these connection terminal sections 75 to outside. In the interposer 70, the lands 74, power supply circuit pattern 71 or the ground pattern 72 on the component part mounting surface 70a and the connection terminal sections 75 of the loading surface 70b are suitably interconnected via a large number of through-holes 77.

In the digital circuit module device 68, the circuit module 60 is loaded in a mounting area on the component part mounting surface 70a of the interposer 70, with e.g., the second sealing resin layer 64 as the mounting surface, as shown in FIG. 34. In the digital circuit module device 68, the connection terminals 63 of the first connecting terminal sections 62, formed on the first sealing resin layer 7 in the circuit module 60, are connected to the lands 74, formed surrounding the mounting area on the interposer 70, by wires 78. The digital circuit module device 68, having the circuit module 60 mounted thereon, forms a sealing resin layer 79 on the component part mounting surface 70a of the interposer 70 to seal the circuit module 60.

In the digital circuit module device 69, the circuit module 60 is loaded in the mounting area on the component part mounting surface 70a of the interposer 70, with the second sealing resin layer 64 as a mounting surface. In the digital circuit module device 68, solder bumps 81 are bonded to the lands 80 formed on the component part mounting surface 70a of the interposer 70. The circuit module 60 is loaded in position with the connection terminals 66 of the second connecting terminal sections 65 formed on the second sealing resin layer 64 in register with the solder bumps 81. With the digital circuit module device 68, an under-fill 82 is charged into a space between the circuit module 60 and the interposer 70 and e.g., reflow soldering is applied under this condition for mounting the circuit module 60 on the interposer 70.

Figure 36:
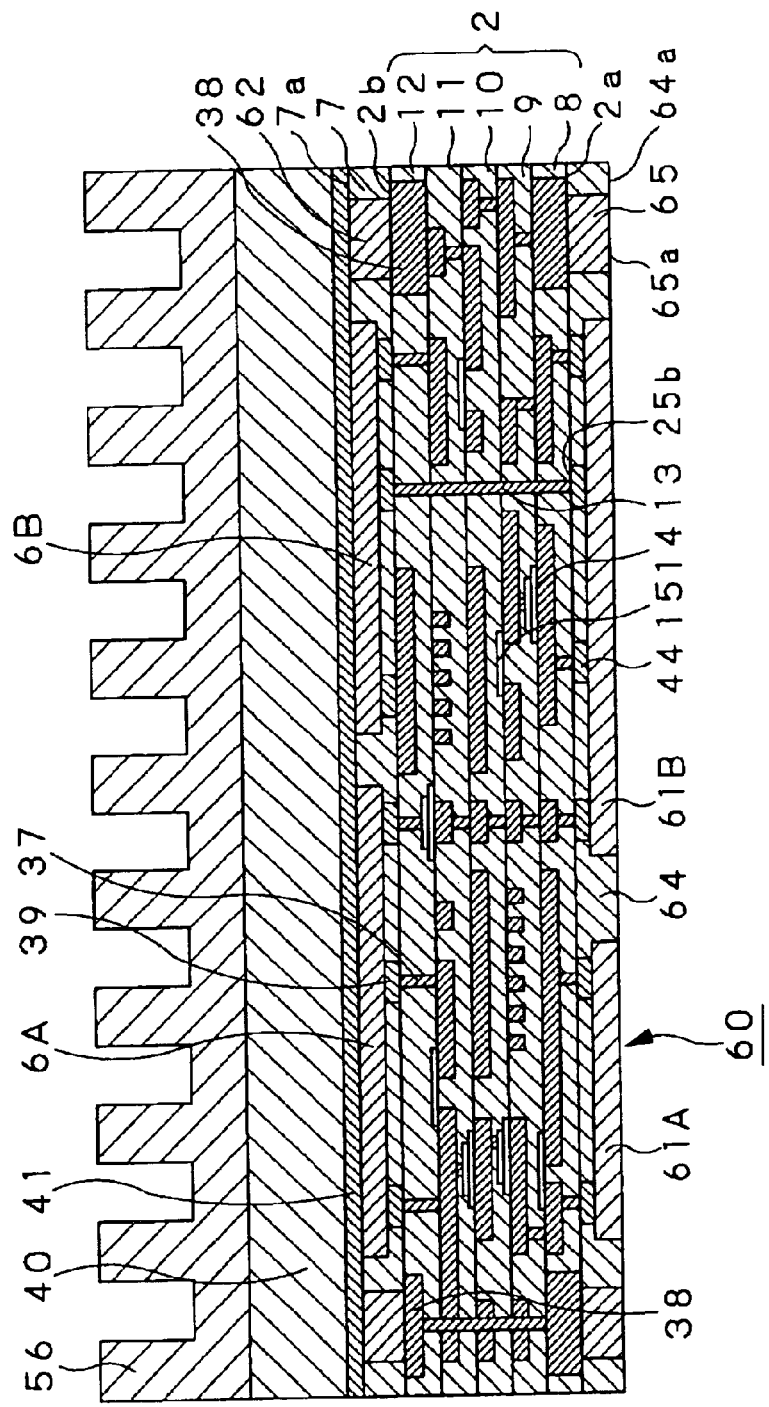
FIG. 36 is a longitudinal cross-sectional view showing essential portions of a multi-chip circuit module provided with a heat radiating member.
Figure 37:
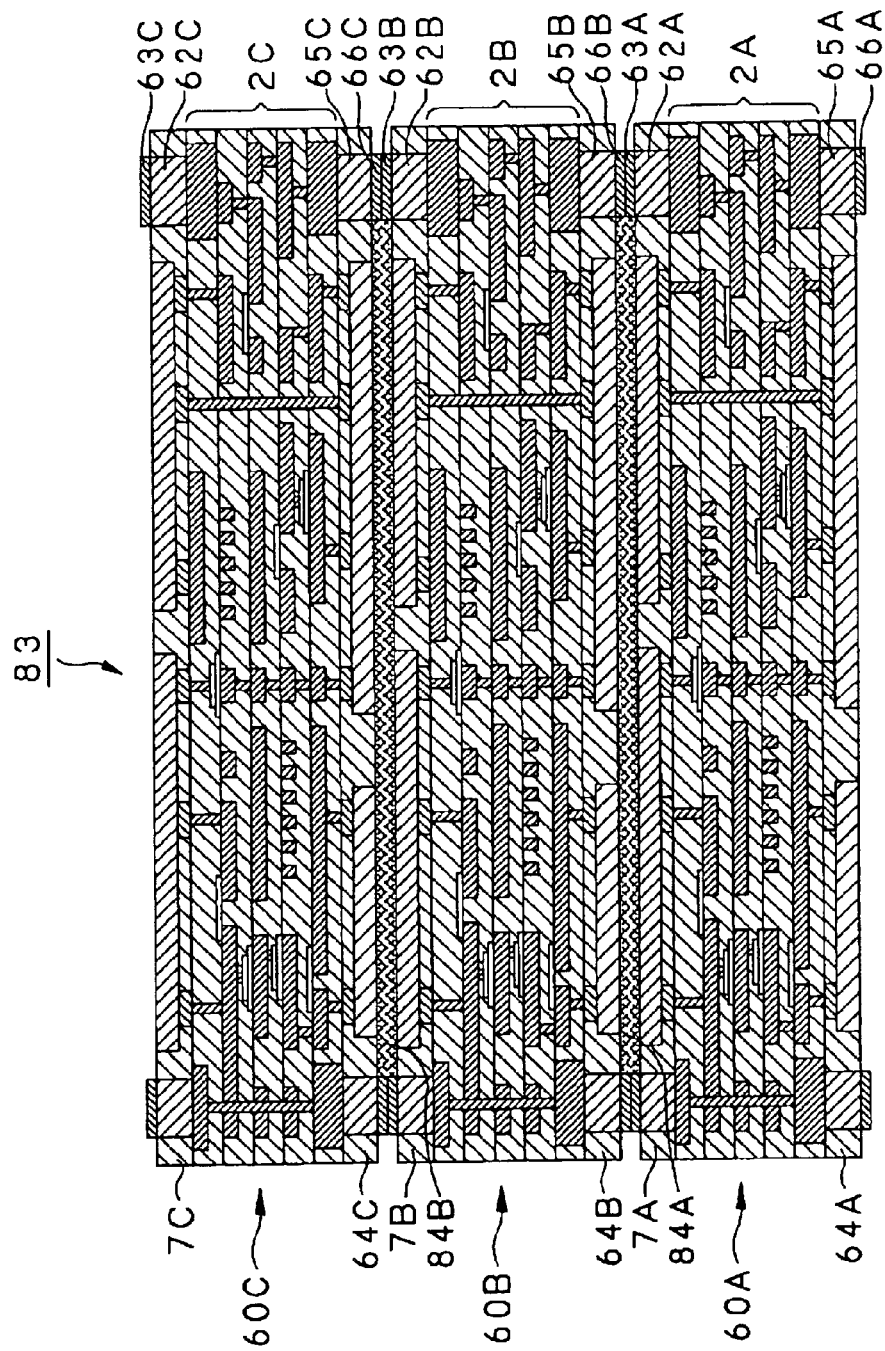
FIG. 37 is a longitudinal cross-sectional view showing essential portions of a main body unit of a multi-layered multi-chip circuit module.
Figure 38:
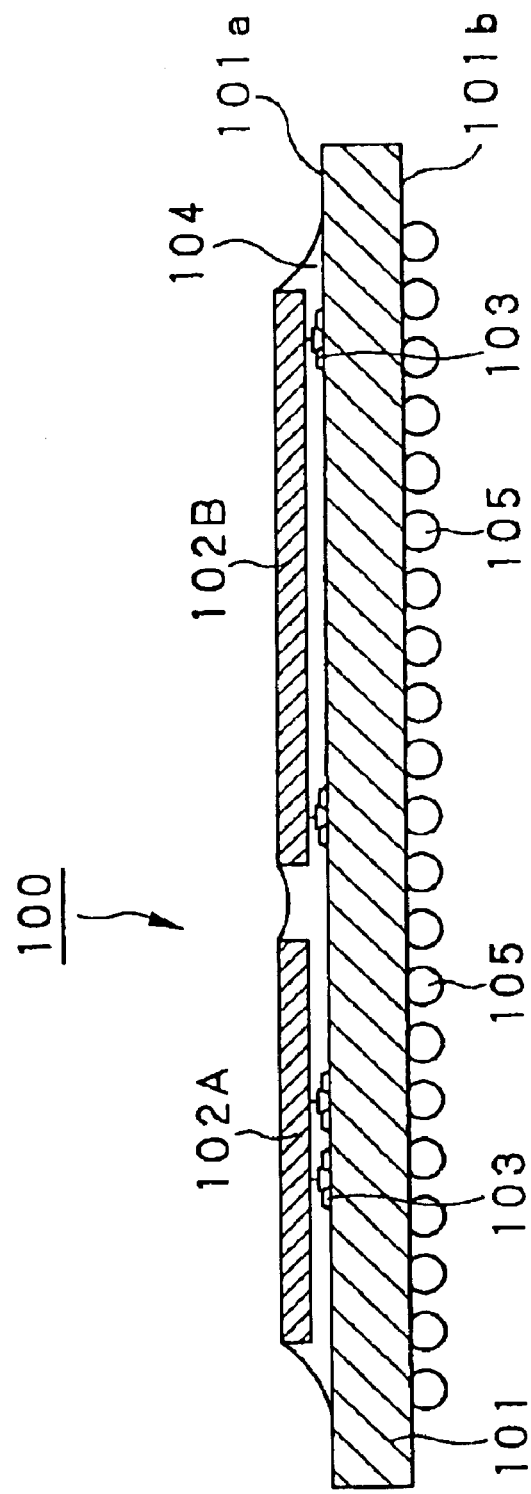
FIG. 38 is a longitudinal cross-sectional view showing essential portions of a main body unit of a conventional multi-chip circuit module.

In the circuit module 60, as in the circuit module 1, the second base substrate 40 may be left over on the second major surface 2b of the multi-layer wiring section 2 for use as a loading member for other component parts. In the circuit module 60, the heat radiating member 56, such as a heat sink, is mounted on the major surface of the second base substrate 40, as shown in FIG. 36, for radiating the heat evolved from the first semiconductor chips 6A, 6B or the second semiconductor chips 61A, 61B in the use state, as shown in FIG. 36.

In the above-described embodiments, only one circuit module 60 is used. Alternatively, a plural number of circuit modules 60A to 60C may be stacked together to form a multi-layered circuit module unit 83. In the circuit module 60, a large number of the connecting terminal sections 62 and a large number of the connecting terminal sections 65 are formed on the surface 7a of the first sealing resin layer 7 and on the surface 64a of the second sealing resin layer 64, respectively. In the circuit module 60, connection terminals 63, 66 are formed by applying gold plating to the surfaces of the connecting terminal sections 62 and the connecting terminal sections 65.

In the multi-layered circuit module unit 83, a second circuit module 60B is layered in position on the first sealing resin layer 7A of the first circuit module 60A with the second sealing resin layer 64B as the mounting surface, with the connecting terminal sections 62A and the connecting terminal sections 65A in register with each other. In the multi-layered circuit module unit 83, an under-fill 84A is charged into a space between the first circuit module 60A and the second circuit module 60B to maintain insulation and guarantee the layered state.

In the multi-layered circuit module unit 83, the first circuit module 60A and the second circuit module 60B are pressured to bond the connection terminals 63A of the connecting terminal sections 62A to the connection terminals 66A of the connecting terminal sections 65B by gold-gold thermal pressure bonding to achieve the unitary layering. Of course, it is possible in the multi-layered circuit module unit 83 to bond the connection terminal 63A of the connecting terminal sections 62A and the connection terminals 66A of the connecting terminal sections 65B by for example ultrasonic bonding method or by any suitable face-down bonding method.

In the multi-layered circuit module unit 83, a third circuit module 60C is layered on the first sealing resin layer 7B of the second circuit module 60B, on the layered unit of the first circuit module 60A and the second circuit module 60B, with a second sealing resin layer 64C as a mounting surface. The third circuit module 60C is layered in position on the second circuit module 60B with the connecting terminal sections 62C, 65b in register with each other. In the multi-layered circuit module unit 83, the circuit modules 60A to 60C are layered together as one by pressuring the third circuit module 60C against the layered unit composed of the first circuit module 60A and the second circuit module 60B.

In the multi-layered circuit module unit 83, a plural number of semiconductor chips 6A, 6B, 61A and 61B are three-dimensionally mounted to high density. Since the circuit modules 60A to 60C of the multi-layered circuit module unit 83 are reduced in thickness, the multi-layered circuit module unit, obtained by layering them together, is also reduced in thickness. In the multi-layered circuit module unit 83, the wiring lengths across the semiconductor chips 6A, 6B, 61A and 61B, mounted three-dimensionally to a high density, are also reduced, so that propagation losses or deterioration of control signals are low to achieve high-speed processing.

Meanwhile, the multi-layered circuit module unit 83 in which the circuit modules 60A to 60C of the same structure are layered together integrally has been shown, only for the sake of convenience for explanation. However, the circuit modules different in the inner structure of the multi-layer wiring section 2 or in the mounting structure of the semiconductor chips are layered together. On the other hand, the multi-layered circuit module unit 83 may be the layered unit of the circuit modules 1 mounting the semiconductor chips 6A, 6B on one surfaces, or may include such circuit module 1 in its structure. Additionally, with the multi-layered circuit module unit 83, the second base substrate 40C may be left on the external circuit module 60C and a heat radiating member may be mounted thereon.

The present invention is not limited to the above-described embodiments, but can obviously be modified by the skilled artisan by correction or substitution of the embodiments within the scope not departing from the purport of the invention.

INDUSTRIAL APPLICABILITY

According to the present invention, described above, a multi-layered wiring section is formed by a multi-layered wiring unit in which respective planarized upper layer unit wiring sections are layered on respective planarized subjacent unit wiring layers, and the semiconductor chips mounted on the multi-layered wiring section are polished for reducing the thickness, so that fine circuit patterns of high density may be formed to high precision for coping with the large-capacity high-speed high density bus interconnecting the respective semiconductor chips in the multi-layered wiring section. The wiring length is reduced to lower the attenuation of signals transmitted as well as to minimize signal delay. The multi-layered wiring section is increased in density, function and speed while being reduced in size and thickness.

What is claimed is:

1. A method for producing a multi-chip circuit module comprising:

forming a first release layer over a surface of a planarized first base substrate;

a first-layer forming step of forming a first wiring layer, obtained by forming an insulating layer over said first release layer, forming a predetermined circuit pattern over or in said insulating layer; applying metal plating over the predetermined circuit pattern, and planarizing a surface of said first-layer wiring layer circuit pattern, said first layer forming step is repeated one or more times to form a multi-layer wiring section wherein each layer is connected to the next via interlayer interfaces;

a first semiconductor chip mounting step of mounting one or more semiconductor chips over a surface of the uppermost wiring layer of said multi-layer wiring section;

a first connection terminal forming step of forming a first connection terminal on a surface of said uppermost wiring layer, a first sealing resin layer forming step of forming a sealing resin layer for sealing said semiconductor chip and said connection terminal over the surface of said uppermost wiring layer;

a first polishing step of performing polishing processing on said sealing resin layer for reducing the size of said semiconductor chip, connection terminal, and said sealing resin layer; and a first peel-off step of peeling the multi-layer wiring section from said first base substrate via said first release layer.

2. The method for producing a multi-chip circuit module according to claim 1 wherein said wiring layer forming step includes a step of forming a pattern groove and a via in said insulating layer.

3. The method for producing a multi-chip circuit module according to claim 1 wherein, said planarizing processing is carried out by a chemical-mechanical polishing method.

4. The method for producing a multi-chip circuit module according to claim 1 wherein said wiring layer forming step includes a step of forming a film of a passive device, such as a capacitance device or a resistance device, on said wiring layer.

5. The method for producing a multi-chip circuit module according to claim 4 wherein said step of forming said passive device comprises a capacitance device having a film of tantalum nitride or a film of tantalum oxide, obtained on anodic oxidation of a tantalum film, as a dielectric material, or a resistance device formed by a tantalum nitride film or a tantalum film.

6. The method for producing a multi-chip circuit module according to claim 1 further comprising:

a step of mounting the circuit module on an interposer via said first connection terminal.

7. A method for producing a multi-chip circuit module characterized in that, by a step of forming a first release layer of a uniform thickness over a surface of a planarized first base substrate;

a first-layer forming step of forming a first wiring layer, obtained by forming an insulating layer over said first release layer, forming a predetermined circuit pattern in said insulating layer; applying metal plating over the predetermined circuit pattern, and planarizing a surface of said first-layer wiring layer circuit pattern, said first layer forming step is repeated one or more times to form a multi-layer wiring section wherein each layer is connected to the next via interlayer interfaces;

a first semiconductor chip mounting step of mounting one or more semiconductor chips over a surface of the uppermost wiring layer of said multi-layer wiring section;

a first connection terminal forming step of forming a first connection terminal on surface of said uppermost wiring layer, a first sealing resin layer forming step of forming a sealing resin layer for sealing said semiconductor chip and said connection terminal over the surface of said uppermost wiring layer;

a first polishing step of performing polishing processing on said sealing resin layer for reducing the size of said semiconductor chip, connection terminal, and said sealing resin layer; and a second base substrate bonding step of bonding a second base substrate, having a second release layer formed on a planar surface thereof, to the surface of said uppermost unit wiring layer, a first peel-off step of peeling the multi-layer wiring section from said first base substrate via said first release layer;

a second semiconductor chip mounting step of mounting at least one semiconductor chip over the surface of said first-layer wiring layer, a second sealing resin forming step of forming a second sealing resin layer, sealing said semiconductor chip, over the surface of said first-layer wiring layer, and a second polishing step of applying polishing processing to said second sealing resin layer for reducing the size of said second semiconductor chip and said second sealing resin layer.

8. The method for producing a multi-chip circuit module according to claim 7 characterized in that said first semiconductor chip mounting step includes a first connection terminal forming step of forming a first connection terminal over the surface of said uppermost wiring layer, said first polishing step being a step of polishing said first sealing resin layer along with said first semiconductor chip to expose said first connection terminal;

and said second semiconductor chip mounting step includes a second connection terminal forming step of forming a second connection terminal over the surface of said first-layer wiring layer, said second polishing step being a step of polishing said second sealing resin layer along with said second semiconductor chip to expose said second connection terminal.

9. The method for producing a multi-chip circuit module according to claim 8 characterized in that a multi-layered multi-chip circuit module is prepared by a second base substrate peel-off step of peeling said second base substrate via said second release layer from said uppermost unit wiring layer, and further comprising a layering step of layering a large number of circuit modules by bonding a first connection terminal of the uppermost wiring layer of one device to a second connection terminal of the first-layer wiring layer of an adjacent device to produce a multi-layered multi-chip circuit module.

10. The method for producing a multi-chip circuit module according to claim 8 characterized by a step of forming said second base substrate with a high heat conductivity, leaving the so formed second base substrate on said uppermost wiring layer, and mounting a heat radiating member for dissipating the heat emitted from said second semiconductor chip and through said second base substrate.

* * * * *